(12) United States Patent
You et al.

(10) Patent No.: US 10,063,098 B2
(45) Date of Patent: Aug. 28, 2018

(54) ELECTRONIC MODULE AND METHOD FOR FORMING PACKAGE

(71) Applicant: CYNTEC CO., LTD., Hsinchu (TW)

(72) Inventors: Huei-Ren You, Hsinchu (TW); Bau-Ru Lu, Changhua County (TW); Kaipeng Chiang, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 15/399,742

(22) Filed: Jan. 6, 2017

(65) Prior Publication Data

US 2017/0201125 A1    Jul. 13, 2017

Related U.S. Application Data

(60) Provisional application No. 62/276,252, filed on Jan. 8, 2016.

(51) Int. Cl.
| | |
|---|---|
| *H05K 1/18* | (2006.01) |
| *H02J 50/10* | (2016.01) |
| *H01F 27/24* | (2006.01) |
| *H01F 27/29* | (2006.01) |
| *H05K 1/02* | (2006.01) |
| *H05K 1/11* | (2006.01) |
| *H01F 17/04* | (2006.01) |
| *H05K 3/36* | (2006.01) |
| *H05K 1/14* | (2006.01) |

(52) U.S. Cl.
CPC .............. *H02J 50/10* (2016.02); *H01F 17/04* (2013.01); *H01F 27/24* (2013.01); *H01F 27/29* (2013.01); *H01F 27/292* (2013.01); *H05K 1/0203* (2013.01); *H05K 1/0262* (2013.01); *H05K 1/117* (2013.01); *H05K 1/184* (2013.01); *H05K 3/366* (2013.01); *H01F 2017/048* (2013.01); *H05K 1/141* (2013.01); *H05K 2201/044* (2013.01); *H05K 2201/066* (2013.01); *H05K 2201/086* (2013.01); *H05K 2201/1003* (2013.01); *H05K 2201/10545* (2013.01)

(58) Field of Classification Search
USPC .......................... 361/763, 764, 761; 174/260
See application file for complete search history.

(56) References Cited

U.S. PATENT DOCUMENTS

| | | | |
|---|---|---|---|
| 2013/0249308 A1* | 9/2013 | Yeh .......................... | H02J 7/025 307/104 |
| 2014/0015524 A1* | 1/2014 | Lorenz ................... | G01R 33/09 324/252 |
| 2014/0266538 A1* | 9/2014 | Park ........................ | H01F 27/29 336/192 |

* cited by examiner

*Primary Examiner* — Andargie M Aychillhum
(74) *Attorney, Agent, or Firm* — Min-Lee Teng; Litron Patent & Trademark Office

(57) ABSTRACT

An electronic module is provided. The electronic module comprises an inductor having a magnetic body with a coil encapsulated in the magnetic body and a substrate having electronic devices thereon, wherein a first electrode is disposed on a top surface of the magnetic body and a second electrode is disposed on a lateral surface of the magnetic body, wherein the top surface of the inductor and the bottom surface of the substrate are configured side by side and electrically connected to each other, wherein a plurality of third electrodes are disposed on a lateral surface of the substrate, for electrically connecting the electronic module to an external circuit board.

20 Claims, 19 Drawing Sheets

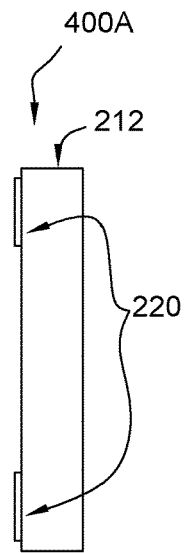
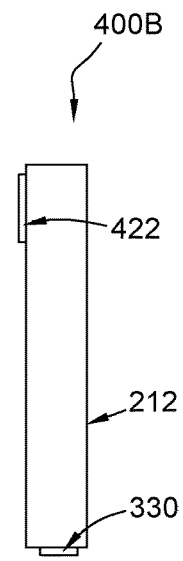
FIG. 4A                    FIG. 4B
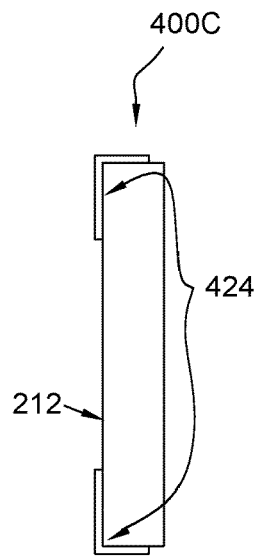
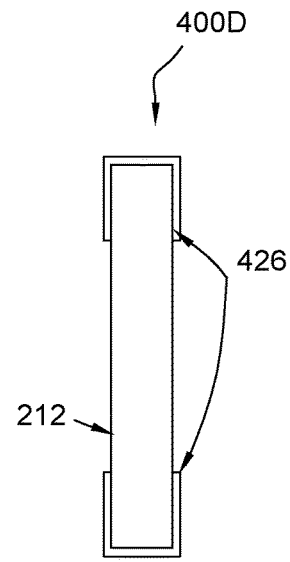
FIG. 4C                    FIG. 4D

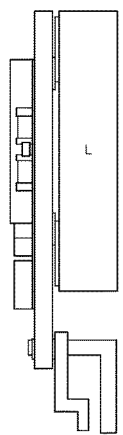 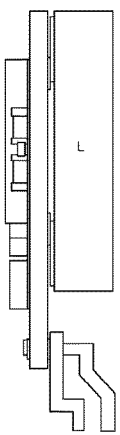 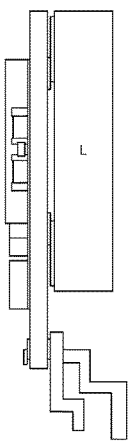
FIG.29K   FIG.29L   FIG.29M
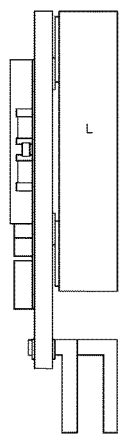 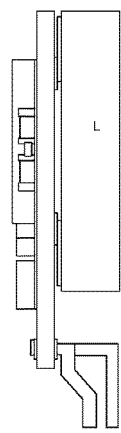 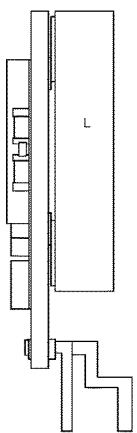 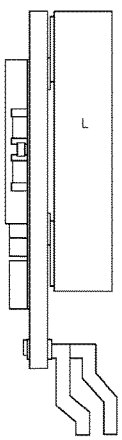 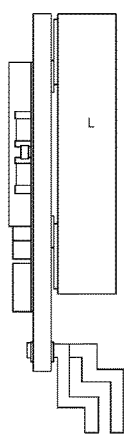
FIG.29N   FIG.29O   FIG.29P   FIG.29Q   FIG.29R
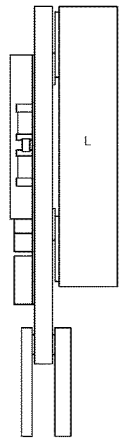 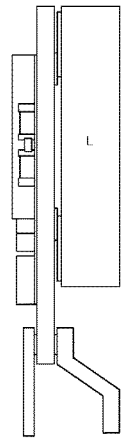 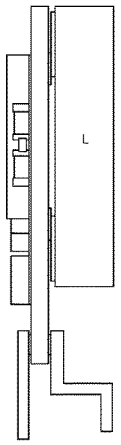 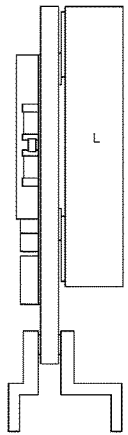
FIG.29S   FIG.29T   FIG.29U   FIG.29V

ELECTRONIC MODULE AND METHOD FOR FORMING PACKAGE

CROSS-REFERENCE TO RELATED APPLICATIONS

The present application claims the benefit of U.S. Provisional Application Ser. No. 62/276,252 filed on Jan. 8, 2016, the entirety of which is incorporated by reference herein.

BACKGROUND OF THE INVENTION

Field of the Invention

The invention relates to electronic modules and methods for forming a package structure thereof.

Description of the Related Art

Electronic modules, such as conventional VRMs (Voltage Regulator Modules), typically include electronic devices, electrically connected to a substrate. The electronic devices are coupled to pins for connection to conductive patterns and/or other electronic assemblies.

Conventional system design with a power module, such as a Voltage Regulator Module (VRM), is made by assembling individual devices together, or by designing stacked devices over one another. For example, as shown in FIG. 1, a CPU 110 is disposed next to a fixed hole 120, and a voltage regulator module 140 is disposed outside the line zones 130 that include the fixed hole 120 in the electronic module layout design 100. As a result, the total layout area for the system design with the VRM is still relatively large. Thus, circuit design is more complex. Additionally, it becomes more difficult to reduce parasitic effects, thus, lowering system efficiency.

Accordingly, there is demand for a system design with a power module to solve the aforementioned problems.

SUMMARY OF THE INVENTION

A detailed description is given in the following embodiments with reference to the accompanying drawings.

In an embodiment of the invention, an electronic module is provided. The electronic module comprises: a magnetic device, comprising a body, wherein the body comprises a top surface, a bottom surface and a lateral surface connecting the top surface and the bottom surface of the body, wherein a first electrode and a second electrode of the magnetic device are disposed on the body; a first substrate, comprising conductive patterns therein and having a top surface, a bottom surface and a lateral surface connecting the top surface and the bottom surface of the first substrate, wherein at least one electronic device is disposed on the top or bottom surface of the first substrate, and the top surface of the magnetic body and the second bottom surface of the first substrate are placed side by side, and the first electrode of the magnetic device is electrically connected to the first substrate, wherein a plurality of third electrodes are disposed on the substrate along the lateral surface of the first substrate and each of the plurality of third electrodes is in contact with and electrically connected to the second substrate.

In one embodiment, the body is a magnetic body and a coil is disposed in the magnetic body, wherein the coil is electrically connected to a power device on the substrate through the first electrode of the magnetic device such that said power device is capable of providing power to the second substrate through the coil.

In one embodiment, the first substrate is a PCB (printed circuit board), ceramic substrate, metallic substrate, insulated metal substrate (IMS) or a lead frame.

In one embodiment, at least one portion of the second electrode of the magnetic device is disposed on the top surface of the magnetic body and electrically connected to the first substrate, wherein the lateral surface of the magnetic body is disposed on the second substrate.

In one embodiment, at least one portion of the second electrode of the magnetic device is disposed on the lateral surface of the magnetic body, wherein the second electrode of the magnetic device is in contact with and electrically connected to the second substrate.

In one embodiment, at least one portion of the second electrode of the magnetic device is disposed on the top surface of the magnetic body and electrically connected to the first substrate, wherein a conductive structure is disposed below the lateral surface of the magnetic body and electrically connected to the first substrate.

In one embodiment, the magnetic device is an inductor or a choke.

In one embodiment, the lateral surface of the magnetic body is adhered to the second substrate to increase the mechanical strength therebetween.

In one embodiment, each of the plurality of third electrodes is disposed in a recess or through-opening on the lateral surface of the substrate.

In one embodiment, each of the plurality of third electrodes extends from the lateral surface of the substrate to a portion of the top surface or the bottom surface of the substrate.

In one embodiment, wherein the lateral surface of the magnetic body and the lateral surface of the first substrate are substantially at a same horizontal level.

In one embodiment, a first recess is on the top or bottom surface of the substrate, wherein each of the plurality of third electrodes is dispose in the first recess.

In one embodiment, a first recess is on the top or bottom surface of the substrate, wherein each of the plurality of third electrodes extends from the lateral surface of the substrate to the first recess.

In one embodiment, a first recess is on the top surface and a second recess is on the bottom surface of the substrate, wherein each of the plurality of third electrodes extends from the lateral surface of the substrate to the first recess and the second recess.

In one embodiment, each of the plurality of third electrodes has a metal lead, wherein each metal lead is mounted on the top or bottom surface of the first substrate and extends across a corresponding edge of the lateral surface of the substrate for electrically connecting with a second substrate.

In one embodiment, a circuit board, comprising: a first substrate having a top surface, a bottom surface and a lateral surface connecting the top surface and the bottom surface of the first substrate, wherein at least one electronic device is disposed on the top or bottom surface of the first substrate, and a plurality of third electrodes, disposed along the lateral surface of the substrate, wherein at least one portion of each electrode is disposed in a first recess on the top or bottom surface of the substrate for electrically connecting with a second substrate.

In one embodiment, the first recess is on the top surface and a second recess is on the bottom surface of the first substrate, wherein each of the plurality of third electrodes has a first portion disposed in the first recess and a second portion disposed in the second recess.

In one embodiment, the first recess is on the top surface of the first substrate, wherein each of the plurality of third electrodes has a first portion disposed in the first recess and a second portion disposed on the lateral surface of the substrate.

In one embodiment, the first recess having a first depth is on the top surface and a second recess having a second depth larger than the first depth is on the top surface, wherein each of the plurality of third electrodes has a first portion disposed in the first recess and a second portion disposed in the second recess.

In one embodiment, the first recess is on the top surface and a second recess is on the bottom surface of the substrate, wherein each of the plurality of third electrodes has a first portion disposed in the first recess and a second portion disposed in the second recess and a third portion disposed on the lateral surface.

In one embodiment, a circuit board, comprising: a first substrate having a top surface, a bottom surface and a lateral surface connecting the top surface and the bottom surface of the first substrate, wherein at least one electronic device is disposed on the top or bottom surface of the first substrate, and a plurality of metal leads, wherein each metal lead is disposed on the top or bottom surface of the first substrate and extends across a corresponding edge of the lateral surface of the substrate, and wherein each metal lead is in contact with and electrically connecting to a second substrate.

In one embodiment, the plurality of metal leads comprises different shapes of metal leads for supporting the first substrate over the second substrate.

In one embodiment, said different shapes of metal leads comprises an I shape, Z shape and L shape.

In one embodiment, wherein said I shape, Z shape and L shape can be placed in different orientation or mirroring ways.

In one embodiment, wherein at least one portion of each metal lead is encapsulated by an insulating material, and a portion of the metal lead is exposed for electrically connecting with a second substrate.

In another embodiment of the invention, a micro-power source module is provided. The micro-power source module comprises a magnetic body, having a coil encapsulated therein forming an inductor, and a substrate having electronic devices thereon, wherein one of the electronic devices is a power source. At least a portion of a first electrode is disposed on a top surface of the magnetic body of the inductor and is electrically coupled to the power source. The power source is capable of providing power to at least a portion of a second electrode disposed on a lateral surface of the magnetic body of the inductor facing the top surface of an external circuit board via the coil.

BRIEF DESCRIPTION OF THE DRAWINGS

The present invention can be more fully understood by reading the subsequent description and examples with references made to the accompanying drawings, wherein:

FIG. 4A is a partially schematic, upright side view of a magnetic body having single sided electrodes in accordance with an embodiment of the invention;

FIG. 4B is a partially schematic, upright side view of a magnetic body having single and bottom sided electrodes in accordance with another embodiment of the invention;

FIG. 4C is a partially schematic, upright side view of a magnetic body having L-shaped electrodes in accordance with yet another embodiment of the invention;

FIG. 4D is a partially schematic, upright side view of a magnetic body having U-shaped electrodes in accordance with still yet another embodiment of the invention;

DETAILED DESCRIPTION OF THE INVENTION

Figure 1:
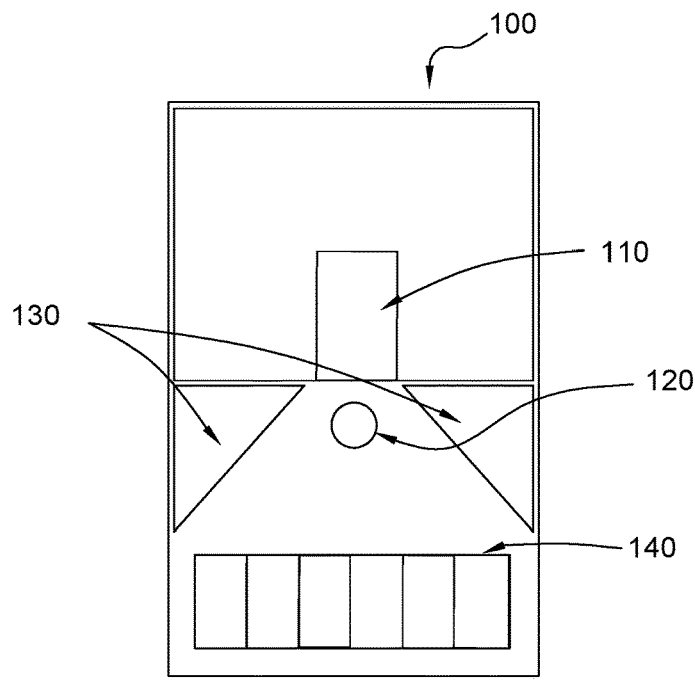
FIG. 1 is a partially schematic electronic module layout design in accordance with the prior art.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Figures 2A, 2B:
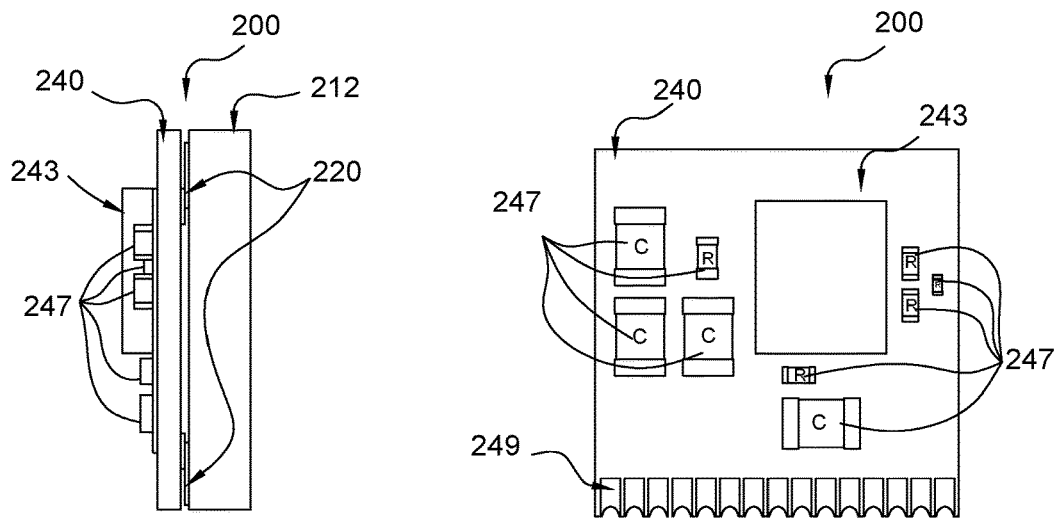
FIG. 2A is a partially schematic, upright side view of an electronic module in accordance with an embodiment of the invention.
FIG. 2B is a partially schematic, upright front view of an electronic module in accordance with an embodiment of the invention.
Figure 2C:
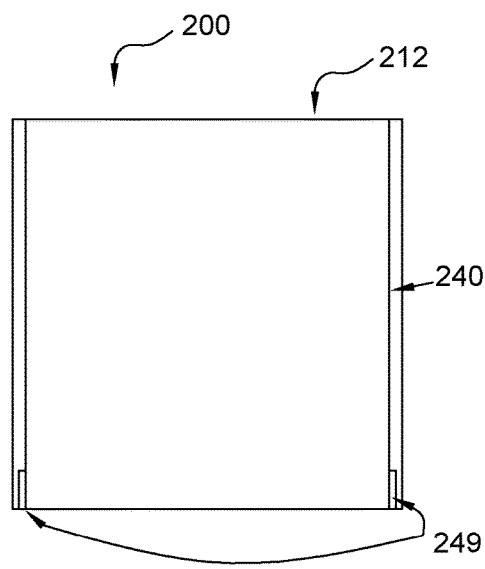
FIG. 2C is a partially schematic, upright back view of an electronic module in accordance with an embodiment of the invention.

FIGS. 2A, 2B and 2C are partially schematic, upright views of an electronic module in accordance with embodiments of the invention. As shown in FIG. 2A, wherein an upright side view of an electronic module 200 is presented, the electronic module 200 comprises a magnetic body 212, and a coil encapsulated in the magnetic body 212, and a substrate 240 having circuits therein. The magnetic body 212 may be a magnetic body 212 of an inductor, wherein the inductor of the embodiments of the invention may comprise a choke, inductive sub-module, or circuit module. The substrate of the embodiments of the invention may be a printed circuit board (PCB), but, the invention is not limited thereto. The substrate of the embodiments of the invention may also be a ceramic substrate, an insulated metal substrate (IMS) and a two-layered or multi-layered substrate. As shown in FIG. 2A and FIG. 2B, the substrate 240 may comprise electronic devices 247 disposed thereon, however, the invention is not limited thereto. The electronic devices 247 may be disposed on a top and bottom surface of the substrate 240. Multiple electronic devices can be packaged as a module 243 which can be disposed on the substrate 240. Meanwhile, the electronic devices 247 of the embodiments of the invention may be a power source and passive and active devices used in any combination. Referring back to FIG. 2A, at least a portion of a first electrode 220 is disposed on a top surface of the magnetic body 212, wherein the top surface of the magnetic body 212 and the bottom surface of the substrate 240 are configured side by side and electrically connected. Also, as shown in FIG. 2A and FIG. 2C, a plurality of surface-mount pads 249 are disposed on a lateral surface of the substrate 240.

Figure 3A:
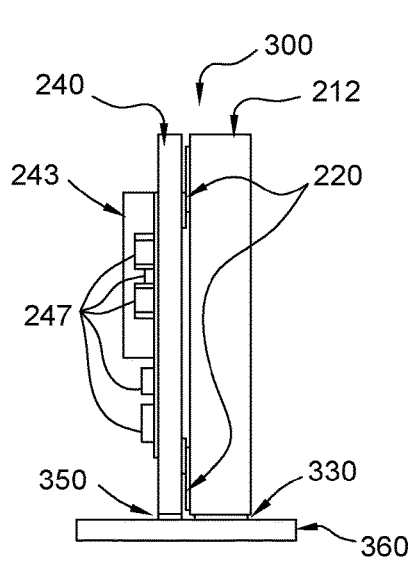
FIG. 3A is a partially schematic, upright side view of an electronic module in accordance with another embodiment of the invention.
Figure 3B:
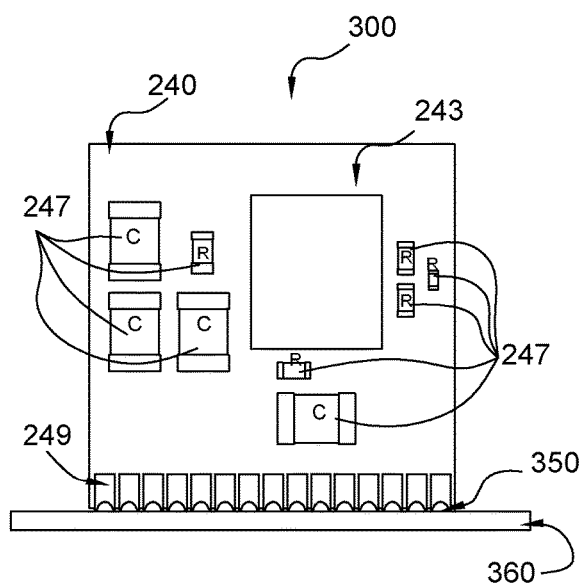
FIG. 3B is a partially schematic, upright front view of an electronic module in accordance with another embodiment of the invention.

In another embodiment of the invention as shown in FIGS. 3A and 3B, wherein upright views of the electronic module 200 of FIGS. 2A-2C are shown, the electronic module 200 is electrically connected to an external circuit board 360 to form, electronic module 300. Accordingly, the main difference in the embodiment of FIGS. 3A and 3B and the embodiments of FIGS. 2A-2C, is that the electronic module 200 is electrically connected to the external circuit board 360 such as a second substrate or a motherboard. Referring to FIGS. 3A and 3B, in addition to at least a portion of the first electrode 220 being disposed on a top surface of the magnetic body 212 of the inductor, at least a portion of a second electrode 330 is disposed on a lateral surface of the magnetic body 212 facing the top surface of the external circuit board 360. The coil encapsulated in the magnetic body 212 has a first end and a second end and the first and second ends are electrically connected to the first and second electrodes 220, 330, respectively. Meanwhile, for the substrate 240 of the electronic module 300, in addition to being configured side by side with the magnetic body 212 of the inductor, a plurality of third electrodes 350 are disposed on a lateral surface of the substrate 240 facing the top surface of the external circuit board 360. The second electrode 330 of the inductor and the plurality of third electrodes 350 of the substrate 240 electrically connect the electronic module 300 to the external circuit board 360. The electrodes in the embodiments of the invention may be flat surface electrodes exposed on one side, allowing for electrical connectivity.

Still referring FIGS. 3A and 3B, in further embodiments, the second electrode 220 and the plurality of third electrodes 350 comprise surface-mount type pads used for soldering with the external circuit board 360. When soldering is used on the lateral surfaces of the magnetic body of the inductor and the substrate with the external circuit board, greater electrical current may be available and increased stabilization of the upright electronic module on the external circuit board is achieved. In the embodiments of the invention, tin solder is used for the plurality of third electrodes 350, however, the invention is not limited thereto. The plurality of third electrodes 350 may also comprise conductive adhesive or conductive material. Additionally, while at least a portion of the first electrode 220 is disposed on a top surface of the magnetic body 212 of the inductor, and at least a portion of a second electrode 330 is disposed on a lateral surface of the magnetic body 212, the invention is not limited thereto.

FIGS. 4A-4D, are partially schematic, upright side views of magnetic bodies of inductors 400A, 400B, 400C, 400D in accordance with embodiments of the invention, wherein the electrodes thereon are disposed on different area surfaces thereof. As shown in FIG. 4A, single sided electrodes 220 may be disposed on a single side of the magnetic body 212 of the inductor. Meanwhile, in the embodiment of FIG. 4B, a single sided electrode 422 and a bottom sided electrode 330 are disposed on a single and bottom side of the magnetic body 212, respectfully. Also, referring to the embodiment of FIG. 4C, two L-shaped electrodes 424 and referring to the embodiment of FIG. 4D, two U-shaped electrodes 426 are disposed on side and lateral surfaces of the magnetic body 212 of the inductor, respectively.

Referring back to FIGS. 3A and 3B, concerning the additional embodiments of FIGS. 2A~2C, which may also be applied to the embodiments of FIGS. 3A and 3B, they will not be repeated again for brevity.

In another embodiment of the invention, a type of electronic module, such as a micro-power source module, may be provided. In the embodiment, with reference to the electronic module 300 of FIGS. 3A and 3B, the electronic device 243 disposed on the substrate 240 is a power source, wherein the at least a portion of the first electrode 220 is electrically coupled to the electronic device 243. The electronic device 243 is capable of providing power to at least a portion of the second electrode 330 disposed on the lateral surface of the magnetic body 212 of the inductor facing the top surface of the external circuit board 360 via the coil that is disposed in the magnetic body 212. In the embodiment, the plurality of third electrodes 350 disposed on the lateral surface of the substrate 240, also facing the top surface of the external circuit board 360, return power current from the external circuit board 360 to the electronic device 243 disposed on the substrate 240. Additionally, the micro-power source module further comprises a switch, electrically coupled to the coil and the electronic device 243 disposed on the substrate 240. When the switch is turned on, the electronic device 243 provides power to the external circuit board 360 via the at least a portion of the second electrode 330 disposed on the lateral surface of the magnetic body 212 of the inductor facing the top surface of the external circuit board 360 via the coil.

In a further embodiment of the invention, the electronic module may be a circuit module, comprising a substrate having a top surface, a bottom surface and a lateral surface. For descriptive purposes, reference may be made to FIG. 3B of the electronic module 300, noting that for the embodiment of the circuit module of the invention, no magnetic body 212 and inductor therein, and at least a portion are provided therewith. Referring to FIG. 3B, the top and bottom surfaces of the substrate 240 are electrically connected to the lateral surface thereof, wherein at least one electronic device 247 is disposed on the top or bottom surface thereof. Additionally, a plurality of surface-mount pads 249 are disposed on the lateral surface of the substrate 240 facing the top surface of the external circuit board 360 such that the circuit module is electrically connected to corresponding external circuit pads on the external circuit board 360. In the embodiments of the invention, the plurality of surface-mount pads 249 comprise two groups of pads with different pad sizes. The sizes of the pads may vary and the shapes of the pads may be of any shape such as round, oval, triangular, rectangular, and hexagonal. In an embodiment of the invention, each of the plurality of surface-mount pads 249 comprise a through-hole opening between the top and bottom surfaces of the substrate 240 having an opening on the lateral surface of the substrate 240, wherein conductive material may be disposed therein to electrically connect the circuit module to the corresponding external circuit pads on the external circuit board 360. In another embodiment of the invention, each of the plurality of surface-mount pads 249 comprise an embedded via having an opening on the lateral surface of the substrate 240, wherein conductive material may be disposed therein to electrically connect the circuit module to the corresponding external circuit pads on the external circuit board 360.

In the embodiments of the invention, the electrode for connecting the substrate 240 to the external circuit board 360 may be by through-hole lead or pin or surface-mount pad, or any combination thereof. For the through-hole type method, in some embodiments of the invention, single in-line packages may be supported, and for both the SMT and through-hole type methods, zigzag in-line packages and dual in-line packages are supported, however, the invention is not limited thereto. Other types of package types may be supported for the through-hole type method depending upon design requirements. For the SMT type method, in some embodiments of the invention, single-sided and double-sided SMT pads, along with design variations thereof, may be used. Additionally, small outline packages and small outline j-lead packages may be supported, and for both the SMT and through-hole type methods, pin header connections are supported, however, the invention is not limited thereto. Other types of packages and connections may be supported for the SMT type method depending up design requirements. In the embodiments of the invention, solder paste, conductive adhesive tape or conductive materials may be used for electrical connection between the substrate 240 and the external circuit board 360. Meanwhile, shapes and sizes of the supported pins may vary and the materials thereof may comprise metal, alloy or other conductive material.

Figure 5A:
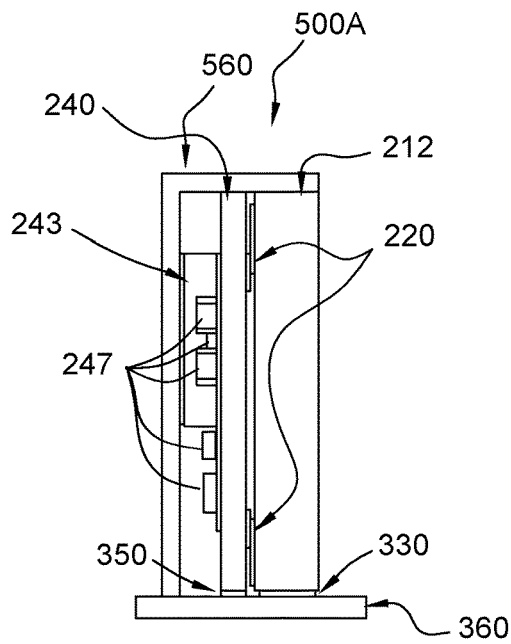
FIG. 5A is a partially schematic, upright side view of the electronic module of FIGS. 3A and 3B having an L-shaped heat sink attached thereto, in accordance with an embodiment of the invention.
Figure 5B:
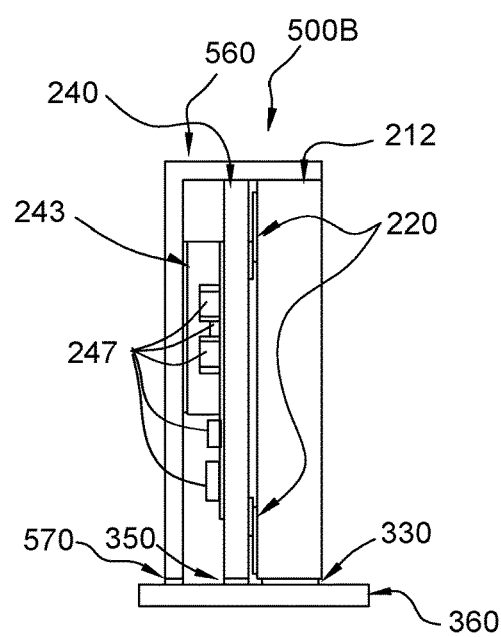
FIG. 5B is a partially schematic, upright side view of the electronic module of FIGS. 3A and 3B having an L-shaped heat sink attached thereto, in accordance with another embodiment of the invention.
Figure 6A:
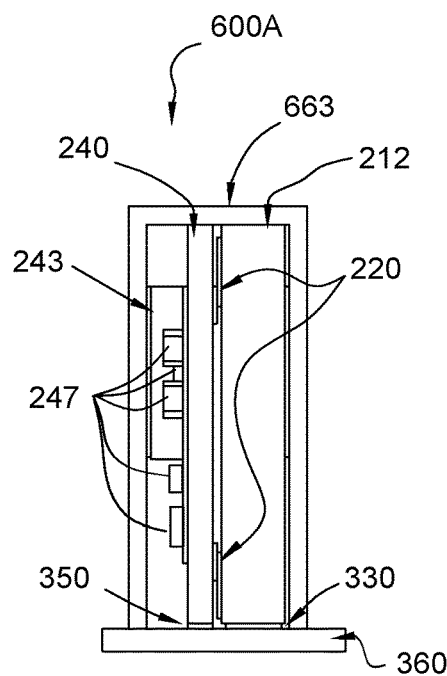
FIG. 6A is a partially schematic, upright side view of the electronic module of FIGS. 3A and 3B having a U-shaped heat sink attached thereto, in accordance with an embodiment of the invention.
Figure 6B:
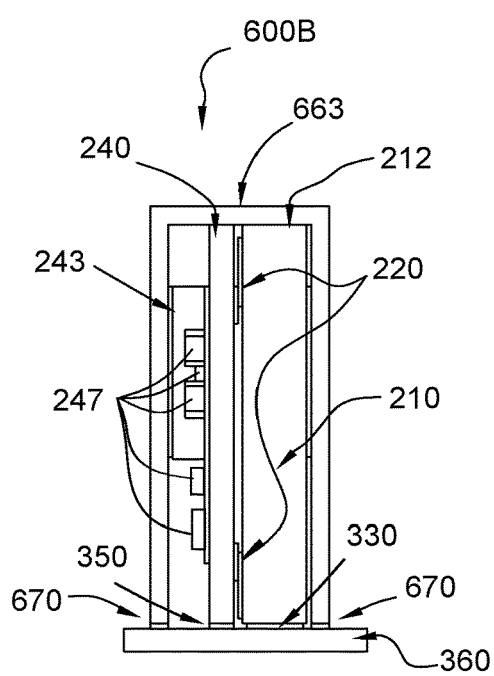
FIG. 6B is a partially schematic, upright side view of the electronic module of FIGS. 3A and 3B having a U-shaped heat sink attached thereto, in accordance with another embodiment of the invention.

FIGS. 5A, 5B, 6A and 6B, are partially schematic, upright side views of the electronic module 300 of FIGS. 3A and 3B, wherein a heat sink is attached thereto. Accordingly, the main difference in the embodiment of FIGS. 3A and 3B and the embodiments of FIGS. 5~6, is that a heat sink is attached to the electronic module 300. Referring to the embodiments of FIGS. 5A and 5B, an L-shaped heat sink 560 is attached to the electronic module 300 to form electronic modules 500A and 500B, respectively, however, the invention is not limited thereto. As shown in the embodiments of FIGS. 6A and 6B, a U-shaped heat sink 663 may also be attached to the electronic module 300 to form electronic modules 600A and 600B, or other-shaped heat sinks. The material of the heat sinks in the embodiments of the invention may comprise metal or alloy material. Also, the method for attaching the heat sinks to the electronic modules in the invention may comprise adhesion, high temperature resistant double-sided adhesive tape, high temperature resistant adhesive resin material, hook, or latch. Meanwhile, in the embodiments of the invention, the heat sinks may be fixed or attachable to the external circuit board 360. Referring to the embodiments of FIGS. 5A and 6A, both the L-shaped heat sink 560 and U-shaped heat sink 663, respectively, are not soldered to the external circuit board 360 and may be attachable. Meanwhile, referring to the embodiments of FIGS. 5B and 6B, both the L-shaped heat sink 560 and U-shaped heat sink 663, respectively, are soldered to the external circuit board 360 and are fixed thereto. Referring to FIG. 5B, the L-shaped heat sink 560 is soldered to the external circuit board 360 at a fifth solder 570. Meanwhile, referring to FIG. 6B, the U-shaped heat sink 663 is soldered to the external circuit board 360 at sixth solders 670. For the embodiments of the invention, by adding the heat sink, the upright stability of the electronic modules are enhanced, while heat from the electronic devices on the substrates are allowed to directly dissipate through the areas encased by the heat sinks. Additionally, for the embodiments of FIGS. 5B and 6B, heat from the electronic devices 247 on the substrate 240, not only dissipate through the areas encased by the heat sinks 560, 663, but, due to the fifth solder 570 of FIG. 5B and sixth solders 670 of FIG. 6B, heat may also directly dissipate through the circuitry of the external circuit board 360. Lastly, with the addition of the heat sinks, SMT manufactures may utilizes the heat sinks in their SMT manufacturing processes as a suction area for a suction nozzle mechanism when moving electronic modules from one place to another. As for the additional embodiments of FIGS. 3A and 3B, which may also be applied to the embodiments of FIGS. 5~6, they will not be repeated again for brevity.

Figure 7A:
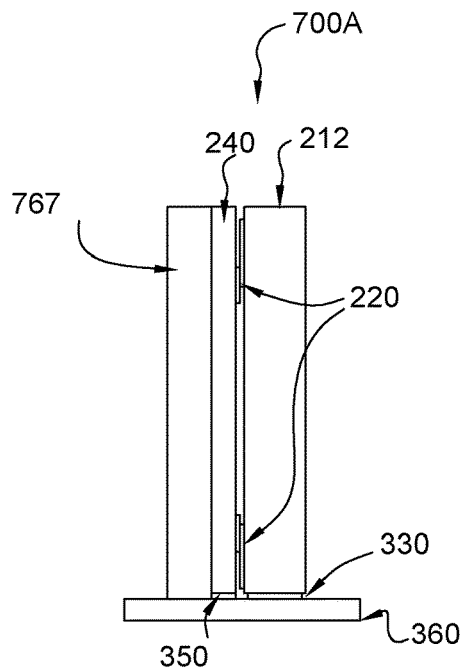
FIG. 7A is a partially schematic, upright side view of the electronic module of FIGS. 3A and 3B partially encased in a molded resin in accordance with an embodiment of the invention.
Figure 7B:
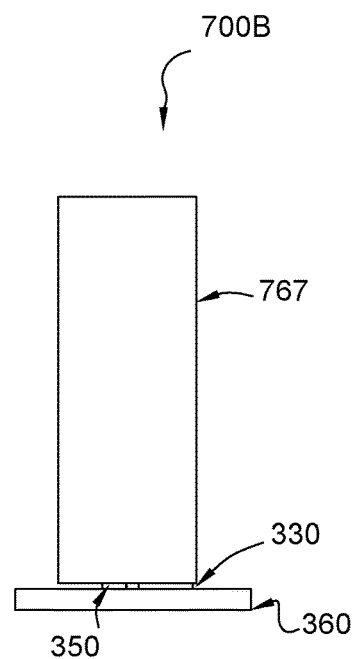
FIG. 7B is a partially schematic, upright side view of the electronic module of FIGS. 3A and 3B encased in a molded resin in accordance with another embodiment of the invention.

In still yet other embodiments of the invention as shown in FIGS. 7A, 7B, 8A and 8B, wherein partially schematic, upright side views of the electronic module 300 of FIGS. 3A and 3B are shown, the electronic module 300 may also be encased in a molded resin, wherein for some embodiments, a heat sink is also attached to the molded resin. Accordingly, the main difference in the embodiment of FIGS. 3A and 3B and the embodiments of FIGS. 7A, 7B, 8A and 8B, is that the electronic module 300 is encased partially or fully in a molded resin or molded resin with an attached heat sink. In the embodiments of the invention, with the encasement, additional protection is provided to the electronic module in addition to increasing the upright stability thereof. Referring to FIGS. 7A and 7B, the electronic module 300 is encased in molded resin, partially or fully, respectively, to form electronic modules 700A and 700B, respectively. Referring to the embodiment of FIG. 7A and referencing FIGS. 3A and 3B, as shown, the substrate 240 of the electronic module 700A comprises electronic devices 247 disposed thereon. The electronic devices 247 are encased in a molded resin 767. Accordingly, the electronic module 700A of FIG. 7A is partially encompassed in the molded resin 767. Meanwhile, at least a portion of a first electrode 220 is disposed on a top surface of the magnetic body 212, wherein the top surface of the magnetic body 212 and the bottom surface of the substrate 240 are configured side by side and electrically connected. Also, a plurality of third electrodes 350 are disposed on the lateral surface of the electronic module 300 facing the top surface of the external circuit board 360 such as a second substrate or a motherboard. The second electrode 330 of the inductor and the plurality of third electrodes 350 of the substrate 240 electrically connect the electronic module 700A to the external circuit board 360. As for the electronic module 700B of the embodiment of FIG. 7B of the invention, in addition to the electronic devices 247, the substrate 240 and the magnetic body 212 of the inductor and all electrical connections therebetween are fully encompassed in the molded resin. Meanwhile, similarly, the second electrode 330 of the inductor and the plurality of third electrodes 350 of the substrate 240 electrically connect the electronic module 700B to the external circuit board 360. As for the additional embodiments of FIGS. 3A and 3B, which may also be applied to the embodiments of FIGS. 7A and 7B, they will not be repeated again for brevity.

Figure 8A:
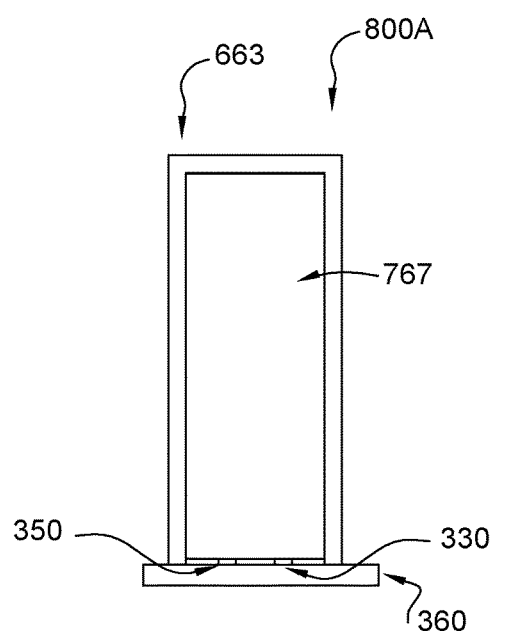
FIG. 8A is a partially schematic, upright side view of the electronic module of FIGS. 3A and 3B encased in a molded resin having a U-shaped heat sink attached thereto, in accordance with an embodiment of the invention.
Figure 8B:
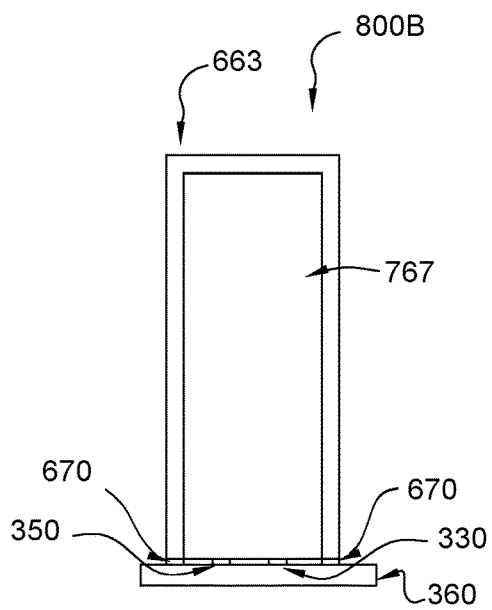
FIG. 8B is a partially schematic, upright side view of the electronic module of FIGS. 3A and 3B encased in a molded resin having a U-shaped heat sink attached thereto, in accordance with another embodiment of the invention.

Referring to FIGS. 8A and 8B and referencing FIGS. 3A and 3B, 6A and 6B, and FIG. 7B, the embodiments of the electronic module 800A and 800B, respectively, are fully encased in a molded resin 865 having a U-shaped heat sink 663 attached thereto. Accordingly, the main difference between the electronic modules 800A, 800B and the electronic module 700B of FIG. 7B, is the U-shaped heat sink attached thereto. Meanwhile, similar to the embodiments FIGS. 6A and 6B of the invention, the heat sinks may be fixed or attachable to the external circuit board 360. Referring to the embodiment of FIG. 8A, the U-shaped heat sink 663 is not soldered to the external circuit board 360 and may be attachable. Meanwhile, referring to the embodiment of FIG. 8B, the U-shaped heat sink 663 is soldered to the external circuit board 360 and are fixed thereto. As shown in FIG. 8B, the U-shaped heat sink 663 is soldered to the external circuit board 360 at solders 670.

In the embodiments of the invention, still referring to FIGS. 8A and 8B, in addition to the aforementioned benefits of heat dissipation and protection, the heat sink encasing also offers a means for electromagnetic interference (EMI) shielding and protection. With the circuitry of the encased electronic modules completely isolated and not subject to external EMI, the encased electronic modules, in turn, do not interfere with other external electronic devices. Meanwhile, for electrostatic discharge (ESD), the plurality of surface-mount pads are disposed on the lateral surface of the magnetic body, wherein the substrate can be used as a grounding mechanism to allow static electricity to be grounded and dissipated, thus, not interfering with the circuitry of the electronic module of the invention. As for the additional embodiments of FIGS. 3A and 3B, 6A and 6B, and FIG. 7B, which may also be applied to the embodiments of FIGS. 8A and 8B, they will not be repeated again for brevity.

In yet further embodiments of the invention, referring to FIGS. 9A, 9B, 9C, and 9D, wherein partially schematic, upright side views of an electronic module are shown, differently shaped support blocks may be disposed between a magnetic body and the external circuit board, along a same bottom surface of a substrate as the magnetic body of the inductor. Accordingly, the main difference between the electronic modules 900A, 900B, 900C, and 900D of FIGS. 9A, 9B, 9C, and 9D and the electronic module 300 of FIGS. 3A and 3B, is the differently shaped support blocks. One function of the differently shaped support blocks is to act as a stabilizer for the upright electronic modules of the invention. Meanwhile, if the material used for the support blocks is conductive material, the support blocks may also function as a conductor for electrical connection between the electronic modules of the invention and the external circuit board. The material of the support blocks comprise metal, alloy, conductive material, high temperature resistant resin material or high temperature non-conductive material.

Figure 9A:
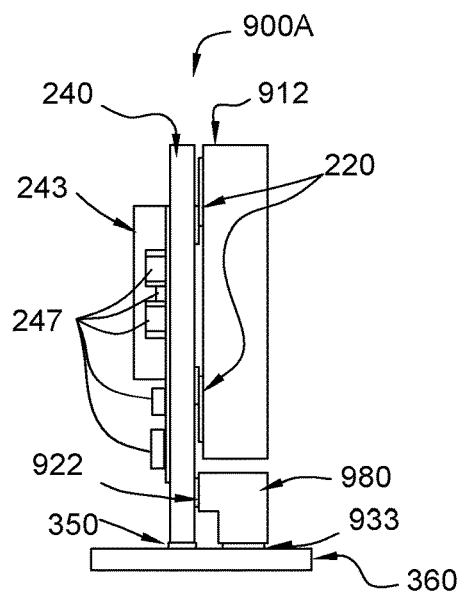
FIG. 9A is a partially schematic, upright side view of an electronic module having an L-shaped support block attached thereto, in accordance with an embodiment of the invention.
Figure 9B:
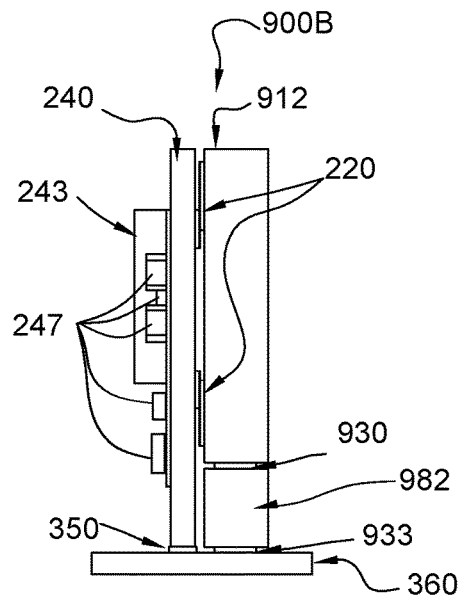
FIG. 9B is a partially schematic, upright side view of an electronic module having a rectangular-shaped support block attached thereto, in accordance with another embodiment of the invention.
Figure 9C:
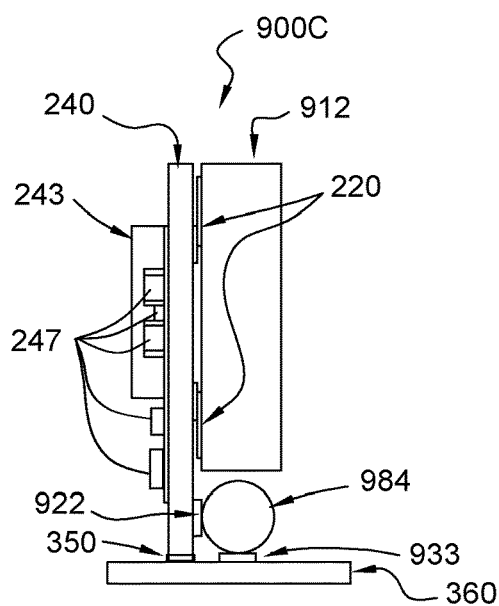
FIG. 9C is a partially schematic, upright side view of an electronic module having a spherical-shaped support block attached thereto, in accordance with yet another embodiment of the invention.
Figure 9D:
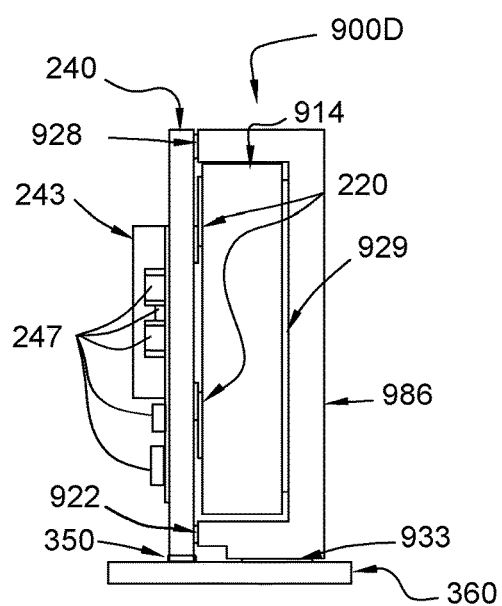
FIG. 9D is a partially schematic, upright side view of an electronic module having a U-shaped support block attached thereto, in accordance with still yet another embodiment of the invention.

Referring to FIG. 9A and referencing FIGS. 3A and 3B, an L-shaped support block 980 is disposed between a magnetic body 912 of an inductor and an external circuit board 360, along a same bottom surface of the substrate 240 as the inductor 912, however, the invention is not limited thereto. As shown in FIGS. 9B and 9C, a rectangular-shaped support block 982 and a spherical-shaped support block 984, respectively, may also be disposed between the inductor 912 and the external circuit board 360, along a same bottom surface of the substrate 240 as the magnetic body 912 of the inductor. Additionally, in yet a further embodiment of the invention, referring to FIG. 9D, a U-shaped support block 986 is disposed surrounding at least a portion of the magnetic body 914 of the inductor.

Meanwhile, still referring to FIGS. 9A, 9B, 9C, and 9D, in the embodiments of the invention, the differently shaped support blocks may or may not be soldered to the magnetic bodies 912, 914 of the inductor or substrate 240 and the electrodes may or may not be disposed on the lateral surfaces of the magnetic bodies 912, 914 of the inductor, respectively. As shown in FIG. 9A, the L-shaped support block 980 is soldered to the substrate 240 at a first solder 222 and the external circuit board 360 at a second solder 933, but not to the lateral surface of the magnetic body 912 of the inductor. In the embodiment, at least a portion of a first electrode 220 is disposed on a top surface of the magnetic body 912 of the inductor, however, no electrode is disposed on the lateral surface thereof. In another embodiment as shown in FIG. 9B, the rectangular-shaped support block 982 is soldered to the external circuit board 360 at a second solder 933, and not to the substrate 240. Additionally, in the embodiment, at least a portion of a first electrode 220 is disposed on a top surface of the magnetic body 912 of the inductor and at least a portion of a second electrode 930 may be disposed on a lateral surface of the magnetic body 912 of the inductor. In a further embodiment, in place of the at least a portion of the second electrode 930, the lateral surface of the magnetic body 912 of the inductor is soldered to the rectangular-shaped support block 982. Meanwhile, in the embodiment of FIG. 9C, the spherical-shaped support block 984 is soldered to the substrate 240 at the first solder 220 and the external circuit board 360 at the second solder 933, but not to the magnetic body 912 of the inductor. In the embodiment, at least a portion of the first electrode 220 is disposed on a top surface of a body 912 of the magnetic body 912 of the inductor, however, no electrode is disposed on a lateral surface thereof. Meanwhile, referring to the embodiment of FIG. 9D, the U-shaped support block 986, disposed surrounding at least a portion of the magnetic body 914 of the inductor, is soldered to the substrate 240 at the first solder 922 and third solder 928, and the external circuit board 360 at the second solder 933. In the embodiment, at least a portion of a first electrode 220 is disposed on a top surface of a magnetic body 912 of the inductor and a fourth electrode 929 is disposed on a bottom surface of the magnetic body 912 of the inductor, opposite to the at least a portion of a first electrode 220 of the magnetic body 914 of the inductor. In a further embodiment, in place of the fourth electrode 929, the bottom surface of the magnetic body 912 of the inductor is soldered to the U-shaped support block 986. As for the additional embodiments of FIGS. 3A and 3B which may also be applied to the embodiments of FIGS. 9A, 9B, 9C and 9D, they will not be repeated again for brevity.

In still yet further embodiments of the invention as shown in FIGS. 10~15, two of the electronic module 300 of FIGS. 3A and 3B and FIGS. 5-9C, may be combined and assembled together in a vertically upright position on an external circuit board, to form an electronic module comprising two magnetic bodies having inductors, each having a body and a coil encapsulated in the magnetic body, and two substrates, each having circuits therein and each having electronic devices disposed thereon. In the embodiments of the invention, the two electronic modules are electrically connected to the external circuit board. For descriptive purposes and brevity, only differences other than having two of the electronic module of FIGS. 3A and 3B or FIGS. 5~9C, respectively, as compared to FIGS. 10~15 will be mainly described. Accordingly, the additional embodiments of FIGS. 3A and 3B and FIGS. 5~9C which may not have been described, may also be applied to the embodiments of FIGS. 10~15. In the embodiments of the invention, the two electronic modules are assembled together using an adhesive 1029. The two electronic modules may be assembled together using high temperature resistant double-sided tape or high temperature resistant resin material which is glued or pasted therebetween.

Figure 10A:
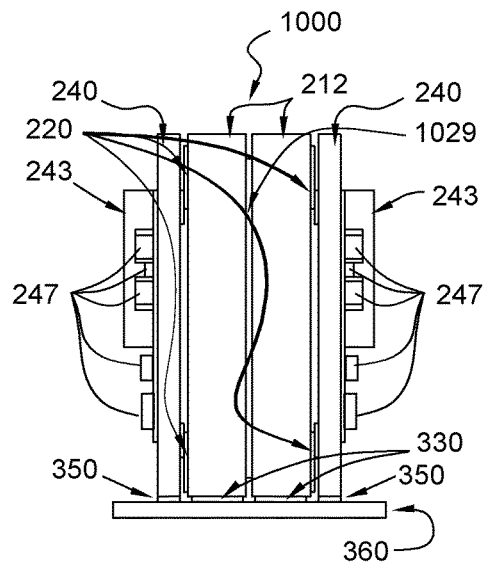
FIG. 10A is a partially schematic, upright side view of two of the electronic module of FIGS. 3A and 3B assembled together in accordance with an embodiment of the invention.
Figure 10B:
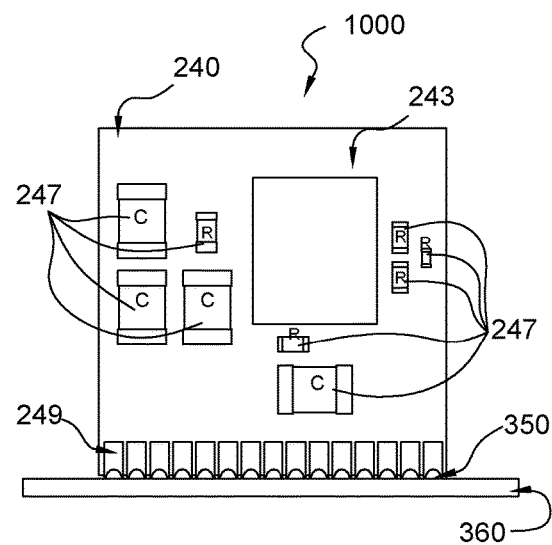
FIG. 10B is a partially schematic, upright front view of two of the electronic module of FIGS. 3A and 3B assembled together in accordance with another embodiment of the invention.

FIGS. 10A and 10B are partially schematic, upright views of two of the electronic module 300 of FIGS. 3A and 3B assembled together in accordance with embodiments of the invention. As shown in FIG. 10A, two electronic modules 300, 300 are assembled together using an adhesive 1029 at bottom surfaces of the magnetic bodies 212, 212 of the inductors, respectively, to form electronic module 1000. Similarly, as shown in FIGS. 10A and 10B, for the electronic module 1000, in addition to at least a portion of the first electrodes 220 being disposed on top surfaces of the magnetic bodies 212, 212 of the inductors, at least a portion of second electrodes 330 is disposed on lateral surfaces of the magnetic bodies 212, 212, respectively, facing the top surface of the external circuit board 360. The coil encapsulated in the magnetic bodies 212, 212 have first ends and second ends and the first and second ends are electrically connected to the first and second electrodes 220, 330, respectively. Meanwhile, for the substrates 240, 240 of the electronic module 1000, in addition to being configured side by side with the magnetic bodies 212, 212 of the inductors, in the embodiments, a plurality of third electrodes 350 are disposed on lateral surfaces of the substrates 240, 240, facing a top surface of the external circuit board 360, respectively. The second electrodes 330 of the magnetic bodies 212, 212 of the inductors and the plurality of third electrodes 350 of the substrates 240, 240 electrically connect the electronic module 1000 to the external circuit board 360.

Figure 11A:
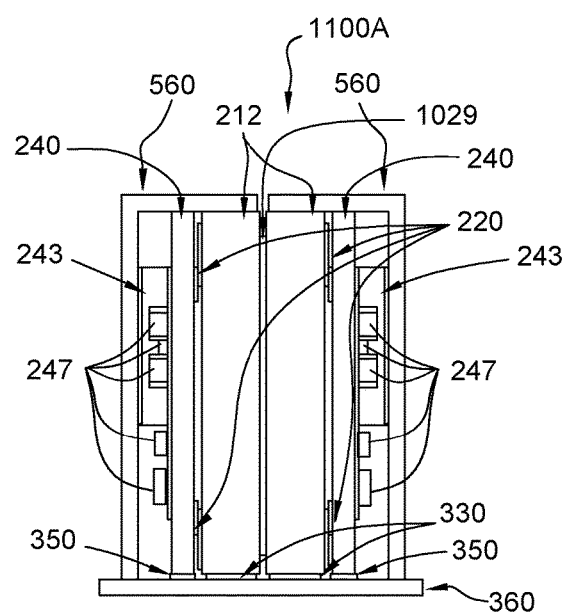
FIG. 11A is a partially schematic, upright side view of two of the electronic module of FIG. 5A assembled together, each having L-shaped heat sinks attached thereto, respectively, in accordance with an embodiment of the invention.
Figure 11B:
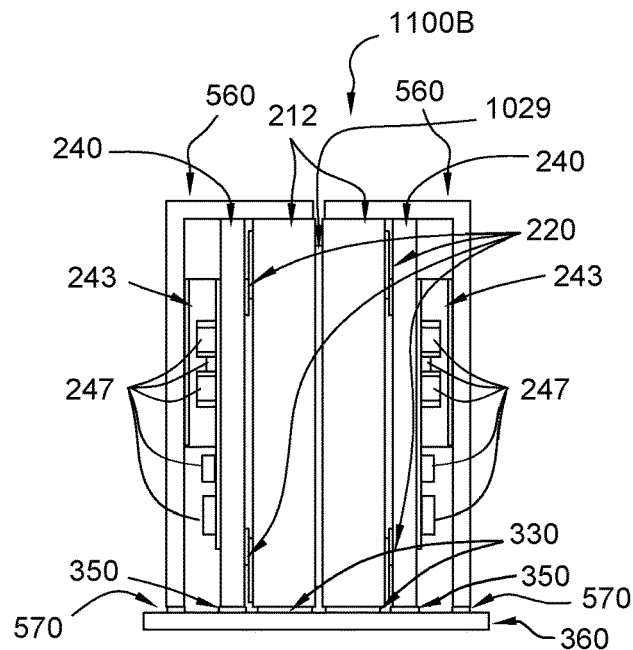
FIG. 11B is a partially schematic, upright side view of two of the electronic module of FIG. 5B assembled together, each having L-shaped heat sinks attached thereto, respectively, in accordance with another embodiment of the invention.

FIGS. 11A and 11B are partially schematic, upright views of two of the electronic modules of FIGS. 5A and 5B, respectively, assembled together in accordance with embodiments of the invention. As shown in FIG. 11A, and referring to FIGS. 3A and 3B and FIG. 5A, two electronic modules 500A, 500A having the L-shaped heat sinks 560, 560 attached thereto, are assembled together using an adhesive 1029 at bottom surfaces of the magnetic bodies 212, 212 of the inductors, respectively, to form electronic module 1100A. Meanwhile, as shown in FIG. 11B, and referring to FIGS. 3A and 3B and FIG. 5B, two electronic modules 500B, 500B having the L-shaped heat sinks 560, 560 attached thereto, are assembled together using an adhesive 1029 at bottom surfaces of the magnetic bodies 212, 212 of the inductors, respectively, to form electronic module 1100B. The material of the heat sinks in the embodiments of the invention may comprise Al, Cu, metal or alloy material and the method for attaching the heat sinks to the electronic modules in the invention may comprise adhesion, high temperature resistant double-sided adhesive tape, high temperature resistant adhesive resin material, hook, or latch. Additionally, in the embodiments of the invention, the heat sinks may be fixed or attachable to the external circuit board 360. Referring to the embodiment of FIG. 11A, both of the L-shaped heat sinks 560, 560, respectively, are not soldered to the external circuit board 360 and may be attachable. Meanwhile, referring to the embodiment of FIG. 11B, both of the L-shaped heat sinks 560, 560, respectively, are soldered to the external circuit board 360 at fifth solders 570 and are fixed thereto. As for the additional embodiments of FIGS. 3A and 3B and FIGS. 5A and 5B, which may also be applied to the embodiments of FIGS. 11A and 11B, respectively, they will not be repeated again for brevity.

Figure 12A:
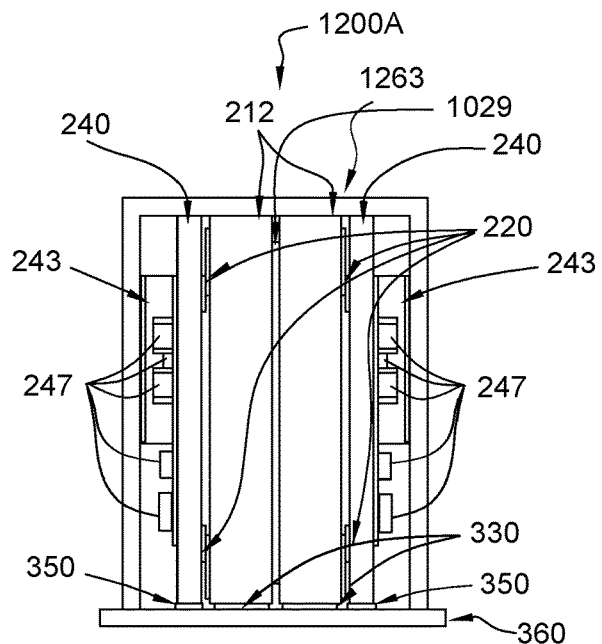
FIG. 12A is a partially schematic, upright side view of two of the electronic module of FIG. 6A assembled together in pairs having a U-shaped heat sink attached thereto, in accordance with an embodiment of the invention.
Figure 12B:
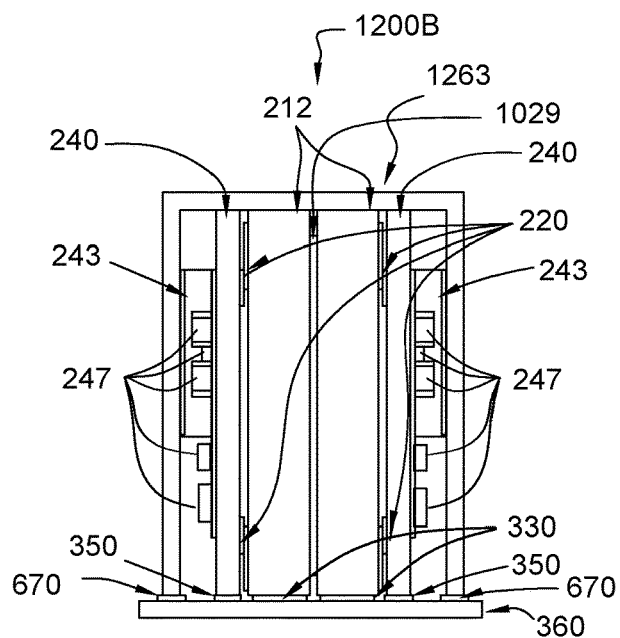
FIG. 12B is a partially schematic, upright side view of two of the electronic module of FIG. 6B assembled together in pairs having a U-shaped heat sink attached thereto, in accordance with another embodiment of the invention.

FIGS. 12A and 12B are partially schematic, upright views of two of the electronic modules of FIGS. 6A and 6B, respectively, assembled together in accordance with embodiments of the invention. As shown in FIG. 12A, and referring to FIGS. 3A and 3B and FIG. 6A, a U-shaped heat sink 1263 is attached to two electronic modules 300, 300 of FIGS. 3A and 3B to form electronic module 1200A. Meanwhile, the two electronic modules 300, 300 are assembled together using an adhesive 1029 at bottom surfaces of the magnetic bodies 212, 212 of the inductors, respectively. Meanwhile, as shown in FIG. 12B, and referring to FIGS. 3A and 3B and FIG. 6B, a U-shaped heat sink 1263 is also attached to two electronic modules 300, 300 of FIGS. 3A and 3B to form electronic module 1200B. Meanwhile, the two electronic modules 300, 300 are assembled together using an adhesive 1029 at bottom surfaces of the magnetic bodies 212, 212 of the inductors, respectively, to form electronic module 1200B. Similar to other embodiments, the material of the heat sinks in the embodiments of the invention may comprise Al, Cu, metal or alloy material and the method for attaching the heat sinks to the electronic modules in the invention may comprise adhesion, high temperature resistant double-sided adhesive tape, high temperature resistant adhesive resin material, hook, or latch. Additionally, in the embodiments of the invention, the heat sinks may be fixed or attachable to the external circuit board 360. Referring to the embodiment of FIG. 12A, the U-shaped heat sink 1263 is not soldered to the external circuit board 360 and may be attachable. Meanwhile, referring to the embodiment of FIG. 12B, the U-shaped heat sink 1263 is soldered to the external circuit board 360 at sixth solders 670 and are fixed thereto. As for the additional embodiments of FIGS. 3A and 3B and FIGS. 6A and 6B, which may also be applied to the embodiments of FIGS. 12A and 12B, respectively, they will not be repeated again for brevity.

Figure 13:
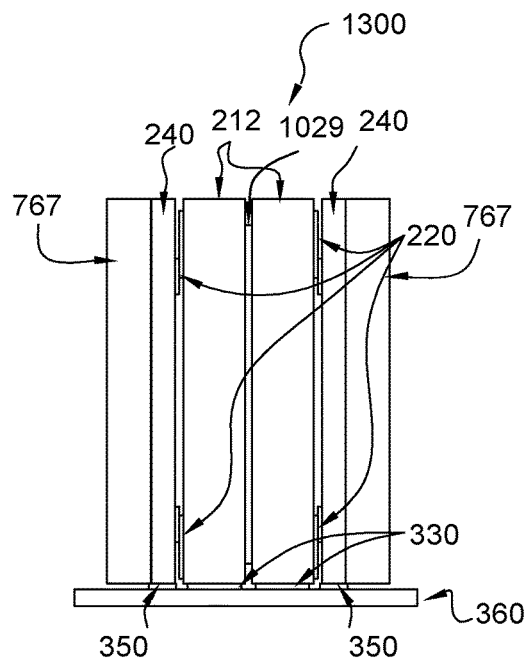
FIG. 13 is a partially schematic, upright side view of two of the electronic module of FIG. 7A assembled together, each partially encased in a molded resin in accordance with an embodiment of the invention.

FIG. 13 is a partially schematic, upright side view of two of the electronic module of FIG. 7A assembled together, each partially encased in a molded resin in accordance with embodiments of the invention. In the embodiments of the invention, with the encasement, additional protection is provided to the electronic module in addition to increasing the upright stability thereof. As shown in FIG. 13 and referring to FIGS. 3A and 3B and FIG. 7A, the substrate 240 of the electronic modules 700A, 700A comprise electronic devices 247 disposed thereon. The electronic devices 247 of the electronic modules 700A, 700A are encased in molded resins 767, 767. The two electronic modules 700A, 700A are assembled together using an adhesive 1029 at bottom surfaces of the magnetic bodies 212, 212 of the inductors, respectively, to form electronic module 1300. Similarly, as shown in FIG. 7A, for the electronic module 1300, in addition to at least a portion of the first electrodes 220 being disposed on top surfaces of the magnetic bodies 212, 212 of the inductors, at least a portion of second electrodes 330 is disposed on lateral surfaces of the magnetic bodies 212, 212, respectively, facing the top surface of the external circuit board 360. The coil encapsulated in the magnetic bodies 212, 212 have first ends and second ends and the first and second ends are electrically connected to the first and second electrodes 220, 330, respectively. Meanwhile, for the substrates 240, 240 of the electronic module 1000, in addition to being configured side by side with the magnetic bodies 212, 212 inductors, a plurality of third electrodes 350 are disposed on lateral surfaces of the substrates 240, 240, facing a top surface of the external circuit board 360, respectively. The second electrodes 330 of the inductor and the plurality of third electrodes 350 of the substrates 240, 240 electrically connect the electronic module 1000 to the external circuit board 360. As for the additional embodiments of FIG. 7A, which may also be applied to the embodiments of FIGS. 3A and 3B and FIG. 7A, they will not be repeated again for brevity. Also note, that while the electronic modules 700A, 700A are partially encased in molded resins, respectfully, they may also be fully encased in molded resins, accordingly, the invention is not limited thereto.

Figure 14A:
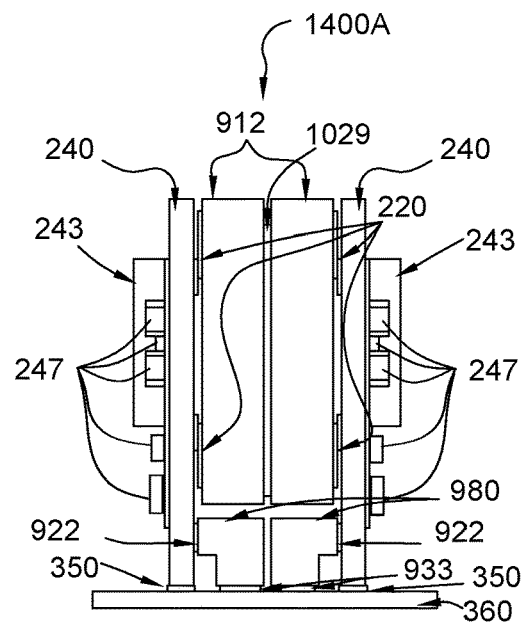
FIG. 14A is a partially schematic, upright side view of two of the electronic module of FIG. 9A assembled together, each having L-shaped support blocks attached thereto, in accordance with an embodiment of the invention.
Figure 14B:
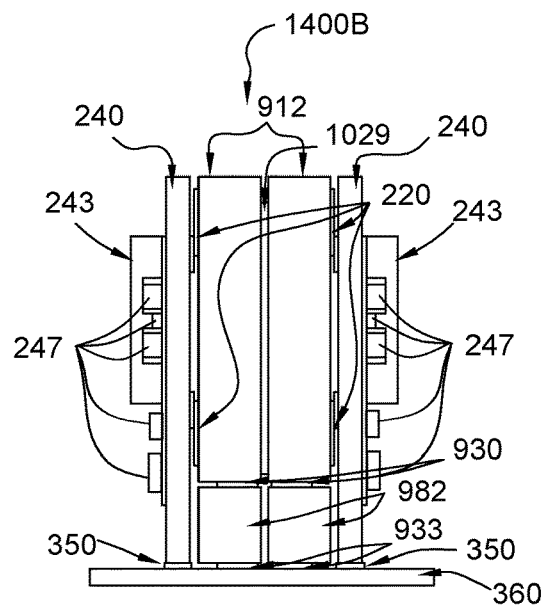
FIG. 14B is a partially schematic, upright side view of two of the electronic module of FIG. 9B assembled together, each having rectangular-shaped support blocks attached thereto, in accordance with another embodiment of the invention.
Figure 14C:
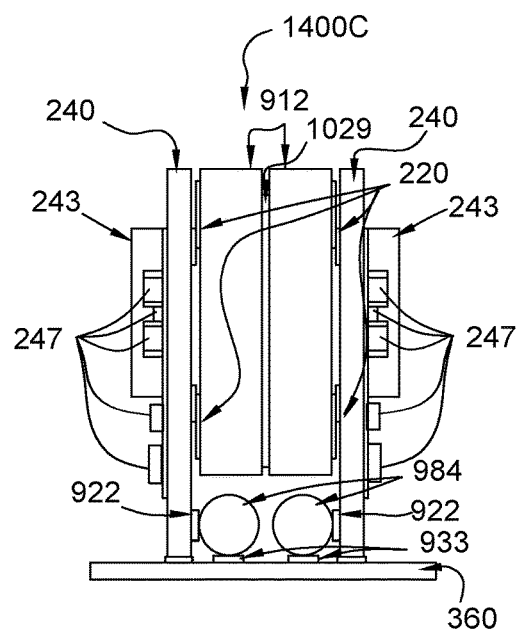
FIG. 14C is a partially schematic, upright side view of two of the electronic module of FIG. 9C assembled together, each having spherical-shaped support blocks attached thereto, in accordance with yet another embodiment of the invention.

FIGS. 14A, 14B, and 14C are partially schematic, upright side views of two of the electronic modules of FIGS. 9A, 9B, and 9C, respectfully, each assembled in pairs together and each having support blocks attached thereto, respectfully, in accordance with embodiments of the invention. One function of the differently shaped support blocks is to act as a stabilizer for the upright electronic modules of the invention. Meanwhile, if the material used for the support blocks is conductive material, the support blocks may also function as a conductor for electrical connection between the electronic modules of the invention and the external circuit board. The material of the support blocks comprise metal, alloy, conductive material, high temperature resistant resin material or high temperature non-conductive material. Note that while in the embodiments of the invention, two of the electronic modules of FIGS. 9A, 9B, and 9C, respectfully, are each assembled in pairs together, the invention is not limited thereto. The electronic modules of FIGS. 9A, 9B, and 9C may also be assembled together in any combination.

Referring to FIG. 14A and referencing FIGS. 3A and 3B and FIG. 9A, L-shaped support blocks 980, 980 are disposed between the magnetic bodies 912, 912 of the inductors and an external circuit board 360, along a same bottom surface of the substrates 240, 240 as the magnetic bodies 912, 912 of the inductors, however, the invention is not limited thereto. As shown in FIGS. 14B and 14C and referencing FIGS. 3A and 3B and FIGS. 9B and 9C, rectangular-shaped support blocks 982, 982 and spherical-shaped support blocks 984, 984, respectively, may also be disposed between the magnetic bodies 912, 912 of the inductors and the external circuit board 360, along a same bottom surface of the substrates 240, 240 as the magnetic bodies 912, 912 of the inductors. Accordingly, two of the electronic module 900A, 900B, and 900C are assembled in pairs together, respectively, using an adhesive 1029 at bottom surfaces of the magnetic bodies 212, 212 of the inductors, respectively, to form electronic modules 1400A, 1400B, and 1400C.

Still referring to FIGS. 14A, 14B, and 14C, in the embodiments of the invention, the differently shaped support blocks may or may not be soldered to the magnetic bodies 912, 912 of the inductor or substrates 240, 240 and the electrodes may or may not be disposed on the lateral surface of the magnetic bodies 912, 912 of the inductors. As shown in FIG. 14A, the L-shaped support blocks 980, 980, disposed between the magnetic bodies 912, 912 of the inductors and the external circuit board 360, along a same bottom surface of the substrates 240, 240 as the magnetic bodies 912, 912 is soldered to the substrates 240, 240 at a first solders 222 and the external circuit board 360 at second solders 933, but not to the lateral surface of the magnetic bodies 912, 912 of the inductors. In the embodiment, at least a portion of first electrodes 220 are disposed on a top surface of the magnetic bodies 912, 912 of the inductors, however, no electrode is disposed on the lateral surface thereof. In another embodiment as shown in FIG. 14B, the rectangular-shaped support blocks 982, 982, disposed between the magnetic bodies 912, 912 of the inductors and the external circuit board 360, along a same bottom surface of the substrates 240, 240 as the magnetic bodies 912, 912 of the inductors, are soldered to the external circuit board 360 at the second solders 933, and not to the substrates 240, 240. Additionally, in the embodiment, at least a portion of first electrode 220 are disposed on a top surface of the magnetic bodies 912, 912 of the inductors and at least a portion of second electrodes 930 are disposed on lateral surfaces of the magnetic bodies 912, 912 of the inductors. Meanwhile, in the embodiment of FIG. 14C, the spherical-shaped support blocks 984, 984, disposed between the magnetic bodies 912, 912 of the inductors and the external circuit board 360, along a same bottom surface of the substrates 240, 240 as the magnetic bodies 912, 912 of the inductors, are soldered to the substrates 240, 240 at first solders 222 and the external circuit board 360 at second solders 933, but not to the magnetic bodies 912, 912 of the inductors. In the embodiment, at least a portion of first electrodes 220 are disposed on a top surface of magnetic bodies 912, 912 of the inductors, however, no electrode is disposed on a lateral surface thereof. As for the additional embodiments of FIGS. 3A and 3B and FIGS. 9A, 9B, and 9C which may also be applied to the embodiments of FIGS. 14A, 14B, and 14C, respectively, they will not be repeated again for brevity.

Figure 15A:
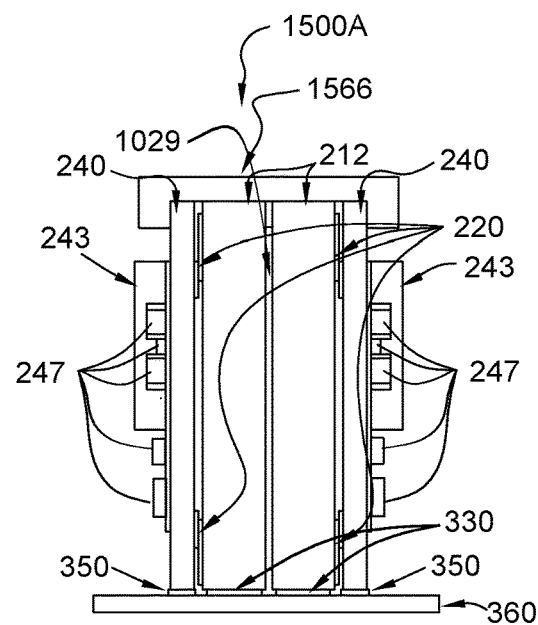
FIG. 15A is a partially schematic, upright side view of two of the electronic module of FIGS. 3A and 3B assembled together in pairs having a U-shaped cap-like structure attached thereon, in accordance with an embodiment of the invention.
Figure 15B:
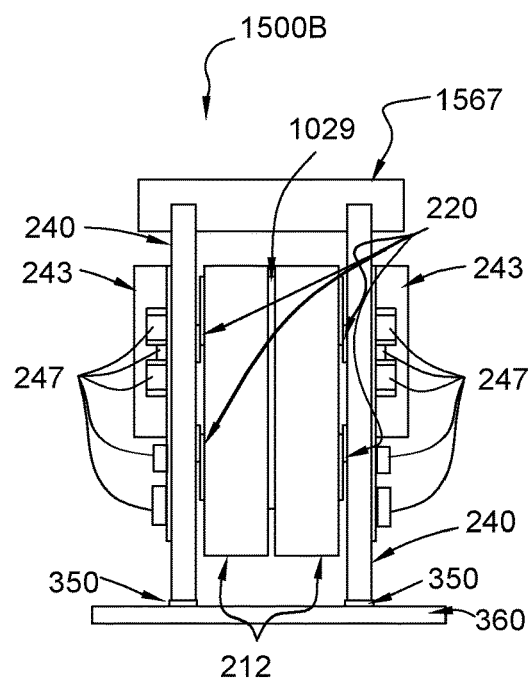
FIG. 15B is a partially schematic, upright side view of two of the electronic module of FIGS. 3A and 3B assembled together in pairs having an E-shaped cap-like structure attached thereon, in accordance with another embodiment of the invention; cap
Figure 15C:
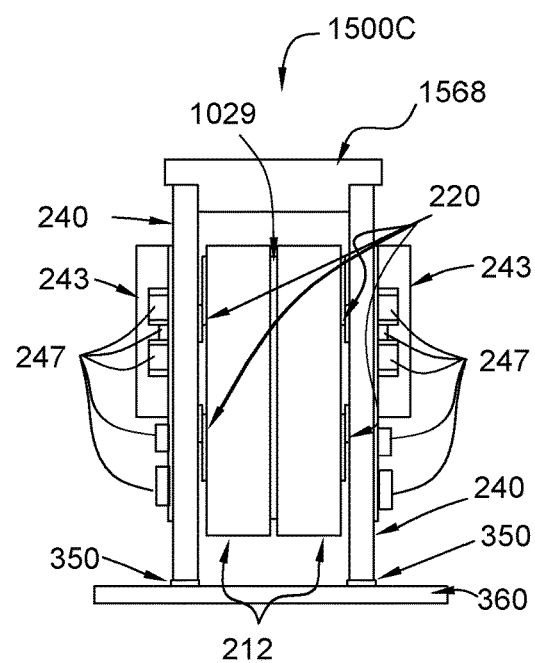
FIG. 15C is a partially schematic, upright side view of two of the electronic module of FIGS. 3A and 3B assembled together in pairs having a T-shaped cap-like structure attached thereon, in accordance with yet another embodiment of the invention.

FIGS. 15A, 15B, 15C and 15D are partially schematic, upright side views of two of the electronic module of FIGS. 3A and 3B assembled together in pairs having cap-like structures attached thereon, in accordance with other embodiments of the invention. One function of the different cap-like structures is for SMT manufactures to utilize the cap-like structures in their SMT manufacturing processes as a suction area for a suction nozzle mechanism or clamping area when moving electronic modules from one place to another. The material of the cap-like structures comprise metal, alloy, high temperature resistant resin material or insulating material. Meanwhile, the method for attaching the cap-like structures to the two electronic modules in the invention may comprise a tight fit arrangement, adhesion, double-sided adhesive tape, adhesive resin material, hook, or latch. As shown in FIG. 15A, two of the electronic modules 300, 300 of FIGS. 3A and 3B are assembled together using an adhesive 1029 at bottom surfaces of the magnetic bodies 212, 212 of the inductors, respectively, have a U-shaped cap-like structure 1566 disposed thereon to form electronic module 1500A; however, the invention is not limited thereto. As shown in FIGS. 15B and 15C, an E-shaped cap-like structure 1567 and a T-shaped cap-like structure 1568, respectively, may be disposed on two of the electronic modules 300, 300 of FIGS. 3A and 3B to form electronic modules 1500B and 1500C, respectfully. In yet a further embodiment of the invention, referring to FIG. 15D, a clamp-like cap-like structure is disposed on two of the electronic modules 300, 300 of FIGS. 3A and 3B to form electronic module 1500D. Similarly, as shown in FIG. 15A, in addition to at least a portion of the first electrodes 220 being disposed on top surfaces of the magnetic bodies 212, 212 of the inductors, at least a portion of second electrodes 330 are disposed on lateral surfaces of the magnetic bodies 212, 212, respectively, facing the top surface of the external circuit board 360. The coil encapsulated in the magnetic bodies 212, 212 have first ends and second ends and the first and second ends are electrically connected to the first and second electrodes 220, 330, respectively; however, the invention is not limited thereto. Referring to the embodiments of FIGS. 15B, 15C, and 15D, while at least a portion of the first electrodes 220 are disposed on top surfaces of the magnetic bodies 212, 212 of the inductors, no portions of second electrodes 330 are disposed on lateral surfaces of the magnetic bodies 212, 212, respectively.

Figure 15D:
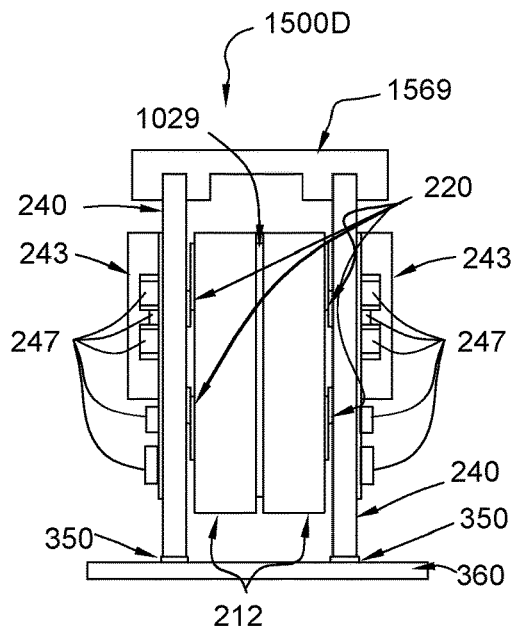
FIG. 15D is a partially schematic, upright side view of two of the electronic module of FIGS. 3A and 3B assembled together in pairs having a clamp-like cap-like structure attached thereon, in accordance with still yet another embodiment of the invention.

Please referring back to FIGS. 15A, 15B, 15C, and 15D, for the substrates 240, 240 of the electronic modules 1500A, 1500B, 1500C, and 1500D, in addition to being configured side by side with the magnetic bodies 212, 212 of the inductors, in the embodiments, a plurality of third electrodes 350 are disposed on lateral surfaces of the substrates 240, 240, facing a top surface of the external circuit board 360, respectively. Referring to FIG. 15A, the second electrodes 330 of the magnetic bodies 212, 212 of the inductors and the plurality of third electrodes 350 of the substrates 240, 240 electrically connect the electronic module 1500A to the external circuit board 360. Referring to FIGS. 15B, 15C, and 15D, the plurality of third electrodes 350 of the substrates 240, 240 electrically connect the electronic modules 1500B, 1500C, and 1500D to the external circuit board 360. As for the additional embodiments of FIGS. 3A and 3B, which may also be applied to the embodiments of FIGS. 15A, 15B, 15C, and 15D, they will not be repeated again for brevity.

Figure 16:
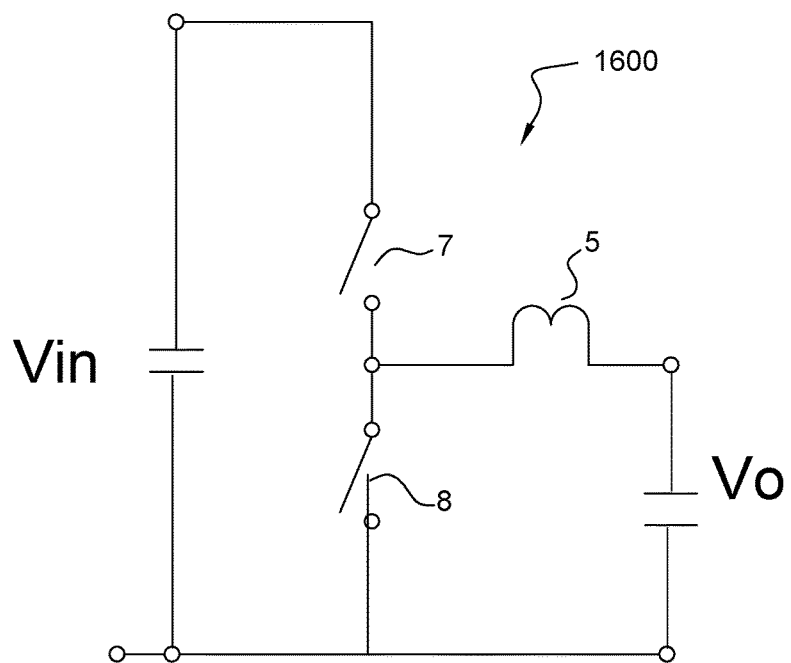
FIG. 16 is a partially schematic diagram of a system in accordance with an embodiment of the invention.

FIG. 16 is a partially schematic diagram 1600 of a system in accordance with embodiments of the invention. Please refer to FIG. 3A and FIG. 16, wherein the magnetic device comprises a magnetic body 212 and a coil 5 is disposed in the magnetic body 212, wherein the coil 5 is electrically connected to a power device 243 on the substrate for proving power source Vin through the first electrode 220 of the magnetic device such that said power device 243 is capable of providing power Vo to the second substrate 360 through the coil 5. In one embodiment, two switches can be used for delivering the power from the power device to the second substrate 360, wherein when the switch 7 is closed, the power will be delivered from the power device to the second substrate 360, and when the switch 8 is closed, the power will not be delivered to the second substrate 360. The power device 243 can be in a single chip, a module or any suitable package.

In another embodiment, as shown in FIG. 2A and FIG. 2C, the plurality of surface-mount pads 249 disposed on a lateral surface of the substrate 240 can be in many different forms. For example, as shown in FIG. 17B, which is a side view when looking at the lateral surface of the substrate 240 along the A-A line in FIG. 17A, wherein each electrode 200 is disposed in the first recess on the top or bottom surface of the substrate so that the electrode 200 can be electrically connected to or soldered to a corresponding pad on the external circuit board 360 such as a second substrate or a motherboard.

Figures 17A, 17B, 17C, 17D, 17E:
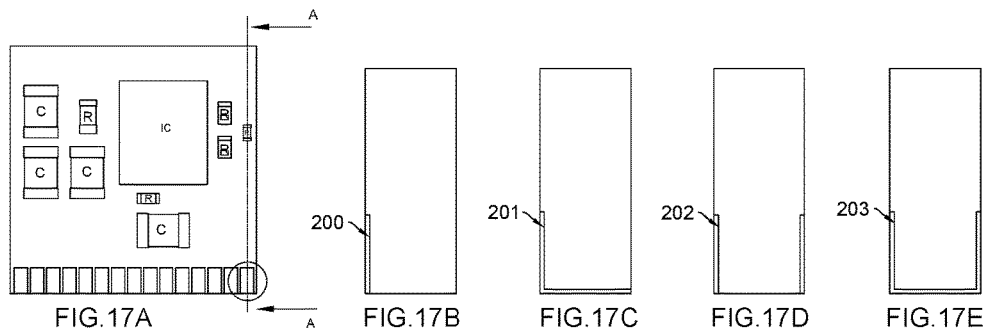
FIG. 17A-17E shows electrodes along an edge of the lateral surface of the substrate in accordance with an embodiment of the invention.

For another example, as shown in FIG. 17B, wherein each electrode 201 has a first portion disposed in the first recess on the top or bottom surface of the substrate and a second portion disposed on the lateral surface of the substrate, so that the electrode 201 can be electrically connected to or soldered to a corresponding pad on the external circuit board 360 such as a second substrate or a motherboard.

For another example, as shown in FIG. 17C, wherein each electrode 202 has a first portion disposed in the first recess on the top or bottom surface of the substrate and a second portion disposed on the lateral surface of the substrate, so that the electrode 202 can be electrically connected to or soldered to a corresponding pad on the external circuit board 360 such as a second substrate or a motherboard.

For another example, as shown in FIG. 17D, wherein each electrode 203 has a first portion disposed in the first recess on the top surface of the substrate, a second portion disposed on the lateral surface of the substrate and a third portion disposed in the first recess on the top surface of the substrate, so that the electrode 203 can be electrically connected to or soldered to a corresponding pad on the external circuit board 360 such as a second substrate or a motherboard.

Figures 18A, 18B, 18C, 18D:
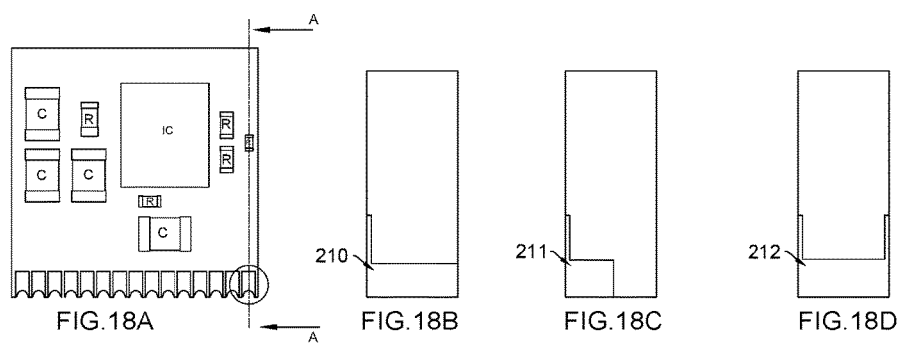
FIG. 18A-18D shows electrodes along an edge of the lateral surface of the substrate in accordance with another embodiment of the invention.
Figures 19A, 19B, 19C, 19D, 19E:
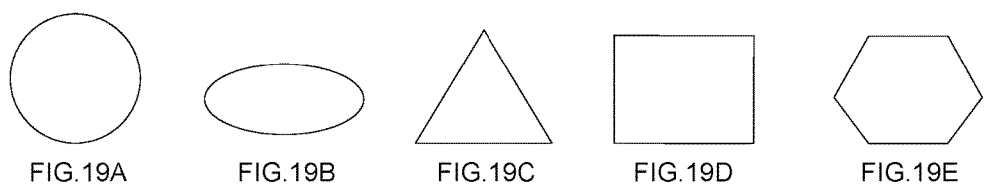
FIG. 19A-19E shows cross-section view of an electrode in accordance with one embodiment of the invention.

In another embodiment, as shown in FIG. 18B, which is a side view when looking at the lateral surface of the substrate 240 along the A-A line in FIG. 18A, wherein each electrode 210 has a first portion disposed in the first recess on the top or bottom surface of the substrate and a second portion disposed in a through hole on the lateral surface of the substrate so that the electrode 210 can be electrically connected to or soldered to a corresponding pad on the external circuit board 360 such as a second substrate or a motherboard.

In another embodiment, as shown in FIG. 18C, which is a side view when looking at the lateral surface of the substrate 240 along the A-A line in FIG. 18A, wherein each electrode 211 has a first portion disposed in a first recess on the top or bottom surface of the substrate and a second portion disposed in a second recess on the same surface of the substrate on which the first recess is disposed on, so that the electrode 211 can be electrically connected to or soldered to a corresponding pad on the external circuit board 360 such as a second substrate or a motherboard.

In another embodiment, as shown in FIG. 18D, which is a side view when looking at the lateral surface of the substrate 240 along the A-A line in FIG. 18A, wherein each electrode 211 has a first portion disposed in the first recess on the top surface of the substrate, a second portion disposed in a through hole on the lateral surface of the substrate and a third portion disposed in the second recess on the bottom surface of the substrate, so that the electrode 211 can be electrically connected to or soldered to a corresponding pad on the external circuit board 360 such as a second substrate or a motherboard.

Figure 20A:
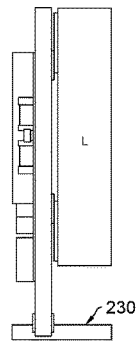
FIG. 20A-20E shows shapes of electrodes in accordance with an embodiment of the invention.

In another embodiment, as shown in FIG. 2A and FIG. 2C, the plurality of surface-mount pads 249 disposed on a lateral surface of the substrate 240 can be in small outline package (SOP). The cross-section view of each lead of the small outline package (SOP) can be in many forms such as a circle, oval, triangle, rectangular or polygon as shown in FIG. 19A-19E. For example, as shown in FIG. 20A, wherein each electrode 230 having a rode shape is disposed on the lateral surface of the substrate 240 so that the electrode 230 can be electrically connected to or soldered to a corresponding pad on the external circuit board 360 such as a second substrate or a motherboard.

Figure 20B:
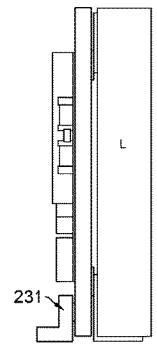

For another example, as shown in FIG. 20B, wherein each electrode 231 having a L shape is disposed on the substrate 240 so that the electrode 231 can be electrically connected to or soldered to a corresponding pad on the external circuit board 360 such as a second substrate or a motherboard.

Figure 20C:
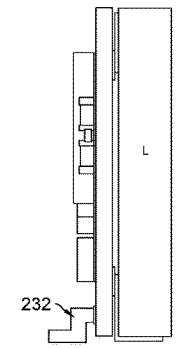

For another example, as shown in FIG. 20C, wherein each electrode 232 having a Z shape is disposed on the substrate 240 so that the electrode 232 can be electrically connected to or soldered to a corresponding pad on the external circuit board 360 such as a second substrate or a motherboard.

Figure 20D:
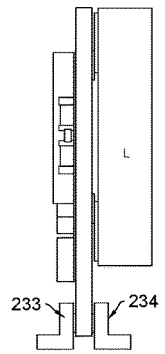

For another example, as shown in FIG. 20D, wherein each electrode has a first L shape 233 disposed on the top surface of the substrate 240 and a second L shape 234 disposed on the bottom surface of the substrate so that the electrode 233, 234 can be electrically connected to or soldered to a corresponding pad on the external circuit board 360 such as a second substrate or a motherboard.

Figure 20E:
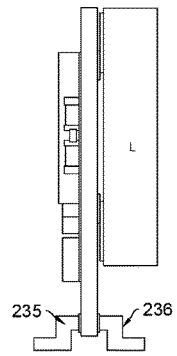

For another example, as shown in FIG. 20E, wherein each electrode has a first Z shape 235 disposed on the top surface of the substrate 240 and a second Z shape 236 disposed on the bottom surface of the substrate so that the electrode 235, 236 can be electrically connected to or soldered to a corresponding pad on the external circuit board 360 such as a second substrate or a motherboard.

Figure 21A:
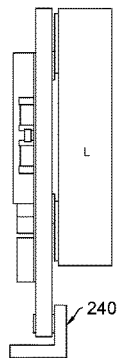
FIG. 21A-21F shows shapes of electrodes in accordance with an embodiment of the invention.

For another example, as shown in FIG. 21A, wherein each electrode 240 having a L shape is disposed on the substrate 240 so that the electrode 240 can be electrically connected to or soldered to a corresponding pad on the external circuit board 360 such as a second substrate or a motherboard.

Figure 21B:
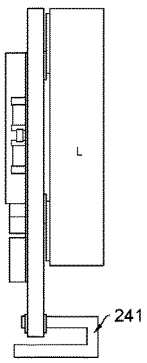

For another example, as shown in FIG. 21B, wherein each electrode 241 having a U shape is disposed on the substrate 240 so that the electrode 241 can be electrically connected to or soldered to a corresponding pad on the external circuit board 360 such as a second substrate or a motherboard.

Figure 21C:
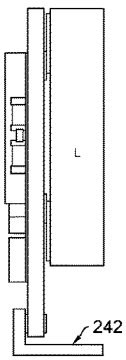

For another example, as shown in FIG. 21C, wherein each electrode 242 having a L shape is disposed on the substrate 240 so that the electrode 242 can be electrically connected to or soldered to a corresponding pad on the external circuit board 360 such as a second substrate or a motherboard.

Figure 21D:
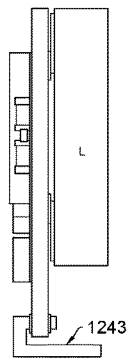

For another example, as shown in FIG. 21D, wherein each electrode 243 having a J shape is disposed on the substrate 240 so that the electrode 1243 can be electrically connected to or soldered to a corresponding pad on the external circuit board 360 such as a second substrate or a motherboard.

Figure 21E:
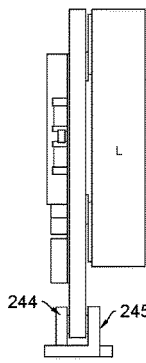

For another example, as shown in FIG. 21E, wherein each electrode has a first L shape 244 disposed on the top surface of the substrate 240 and a second L shape 245 disposed on the bottom surface of the substrate so that the electrode 244, 245 can be electrically connected to or soldered to a corresponding pad on the external circuit board 360 such as a second substrate or a motherboard.

Figure 21F:
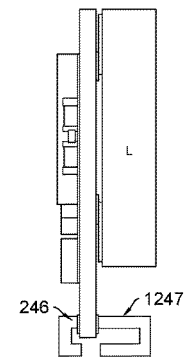

For another example, as shown in FIG. 21F, wherein each electrode has a first E shape 246 disposed on the top surface of the substrate 240 and a second U shape electrode 1247 disposed on the bottom surface of the substrate so that the electrode 246, 247 can be electrically connected to or soldered to a corresponding pad on the external circuit board 360 such as a second substrate or a motherboard.

Figure 22A:
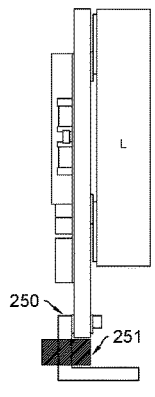
FIG. 22A-22F shows shapes of electrodes in accordance with an embodiment of the invention.

For another example, as shown in FIG. 22A, wherein each electrode 250 having a L shape is inserted into a through hole of the substrate 240, wherein a portion of the lead is encapsulated by a molding material 251, so that the electrode 250 can be electrically connected to or soldered to a corresponding pad on the external circuit board 360 such as a second substrate or a motherboard.

Figure 22B:
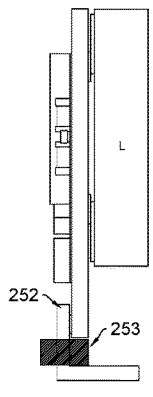

For another example, as shown in FIG. 22B, wherein each electrode 252 having a L shape is surface-mounted on the substrate 240, wherein a portion of the lead is encapsulated by a molding material 253, so that the electrode 252 can be electrically connected to or soldered to a corresponding pad on the external circuit board 360 such as a second substrate or a motherboard.

Figure 22C:
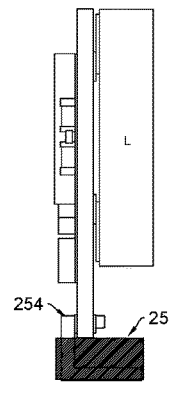

For another example, as shown in FIG. 22C, wherein each electrode 253 having a L shape is inserted into a through hole of the substrate 240, wherein a portion of the lead is encapsulated by a molding material 254, so that the electrode 253 can be electrically connected to or soldered to a corresponding pad on the external circuit board 360 such as a second substrate or a motherboard.

Figure 22D:
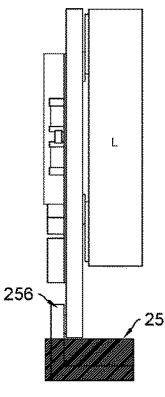

For another example, as shown in FIG. 22D, wherein each electrode 255 having a L shape is surface-mounted on the substrate 240, wherein a portion of the lead is encapsulated by a molding material 256, so that the electrode 255 can be electrically connected to or soldered to a corresponding pad on the external circuit board 360 such as a second substrate or a motherboard.

Figure 22E:
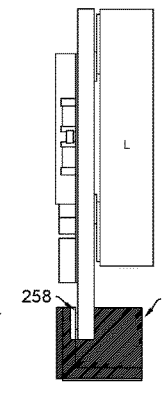

For another example, as shown in FIG. 22E, wherein each electrode 258 having a L shape is surface-mounted on the substrate 240, wherein a portion of the lead is encapsulated by a molding material 259, so that the electrode 258 can be electrically connected to or soldered to a corresponding pad on the external circuit board 360 such as a second substrate or a motherboard.

Figure 22F:
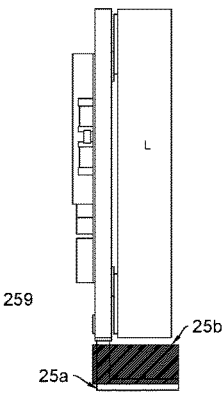
Figures 23A, 23B, 23C, 24A, 24B, 24C:
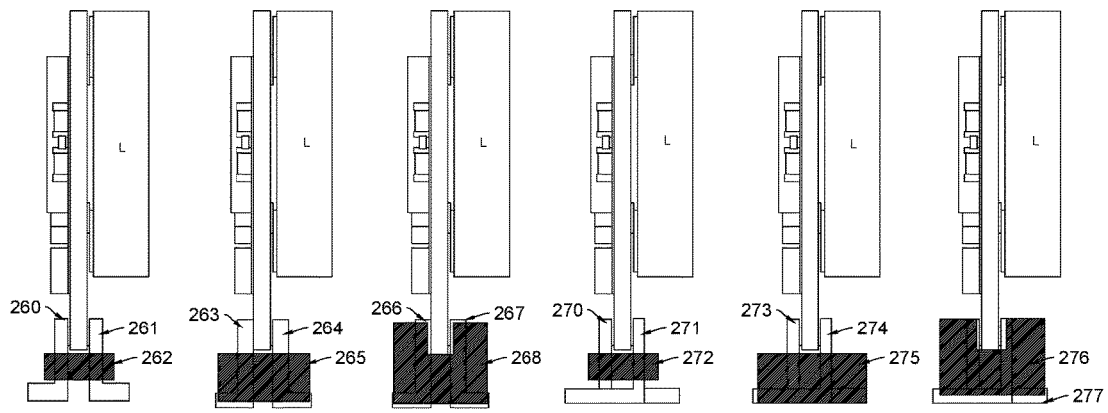
FIG. 23A-23C shows shapes of electrodes in accordance with an embodiment of the invention.
FIG. 24A-24C shows shapes of electrodes in accordance with an embodiment of the invention.
Figures 25A, 25B, 25C, 25D:
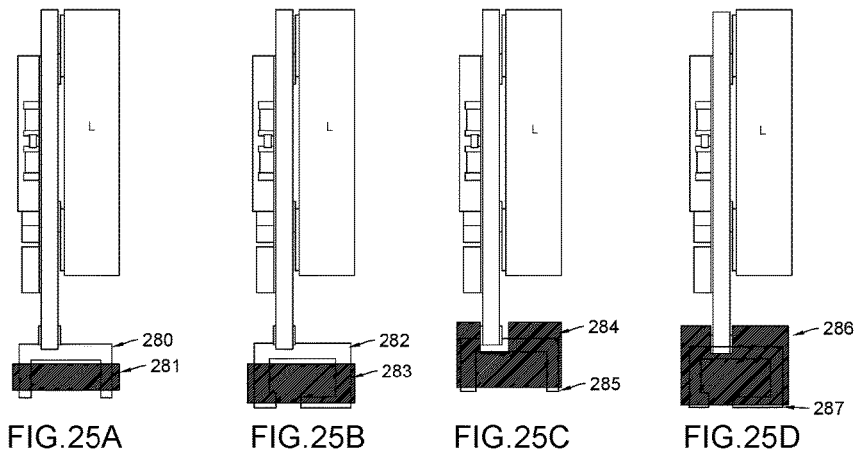
FIG. 25A-25D shows shapes of electrodes in accordance with an embodiment of the invention.

For another example, as shown in FIG. 22F, wherein each electrode 25a having a L shape is surface-mounted on the substrate 240, wherein a portion of the lead is encapsulated by a molding material 25b, so that the electrode 25a can be electrically connected to or soldered to a corresponding pad on the external circuit board 360 such as a second substrate or a motherboard.

They are many combinations of the shapes and the positions of the molding material 262, 265, 268, 272, 275, 276, 281, 283, 284, 286 for encapsulating the leads 260, 261, 263, 264, 266, 267, 270, 271, 273, 274, 277, 280, 282, 285, 287, as shown from FIG. 23A to FIG. 25D, which can be seen by looking at those figures; and therefore, they are not described further.

All of the electrodes described above are for surface-mounting to an external motherboard. In another embodiment, each of the plurality of surface-mount pads 249, in FIG. 2A and FIG. 2C, can be changed to a through-hole pin. For example, as shown in FIG. 26A, wherein each lead 290 having a rode shape is disposed on the substrate 240 so that the electrode 290 can be electrically connected to or soldered to a corresponding pad on the external circuit board 360 such as a second substrate or a motherboard, in addition, a molding material can be used to encapsulate a portion of the lead 291.

Figures 26A, 26B, 26C, 26D:
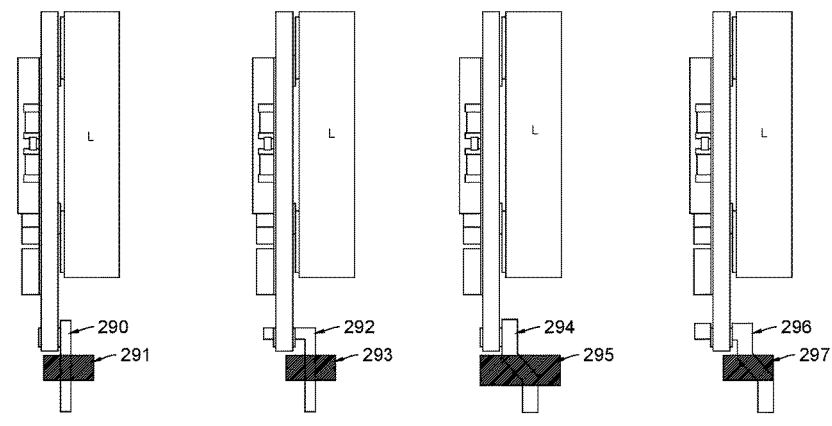
FIG. 26A-26D shows shapes of electrodes in accordance with an embodiment of the invention.

For another example, as shown in FIG. 26B, wherein each lead 292 having a L shape is disposed on the substrate 240 so that the electrode 292 can be electrically connected to or soldered to a corresponding pad on the external circuit board 360 such as a second substrate or a motherboard, in addition, a molding material 293 can be used to encapsulate a portion of the lead 290.

For another example, as shown in FIG. 26C, wherein each lead 294 having a S shape is disposed on the substrate 240 so that the electrode 294 can be electrically connected to or soldered to a corresponding pad on the external circuit board 360 such as a second substrate or a motherboard, in addition, a molding material 295 can be used to encapsulate a portion of the lead 290, wherein the lead 294 is surface-mounted on the substrate 240.

For another example, as shown in FIG. 26D wherein each lead 296 having a S shape is disposed on the substrate 240 so that the electrode 296 can be electrically connected to or soldered to a corresponding pad on the external circuit board 360 such as a second substrate or a motherboard, in addition, a molding material 297 can be used to encapsulate a portion of the lead 296, wherein the lead 296 is inserted into a through-hole of the substrate 240.

Figure 27:
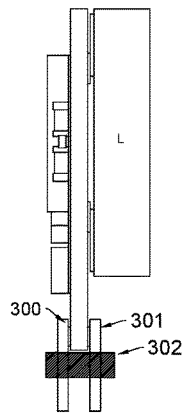
FIG. 27 shows shapes of an electrode in accordance with an embodiment of the invention.
Figure 28A:
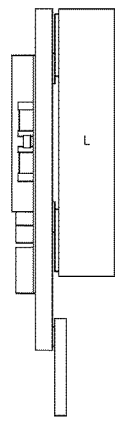
FIG. 28A-28D shows shapes of electrodes in accordance with an embodiment of the invention.
Figure 28B:
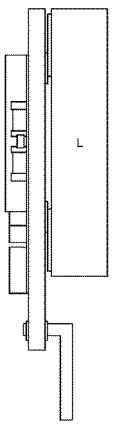
Figure 28C:
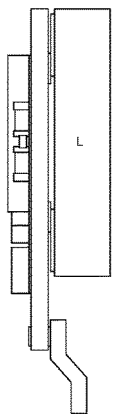
Figure 28D:
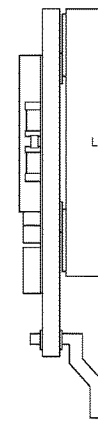
Figure 29A:
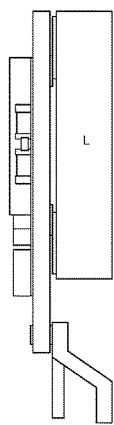
FIG. 29A-29Z shows shapes of electrodes in accordance with an embodiment of the invention.
Figure 29B:
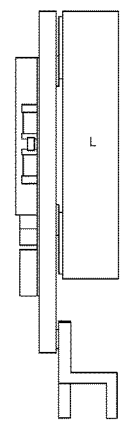
Figure 29C:
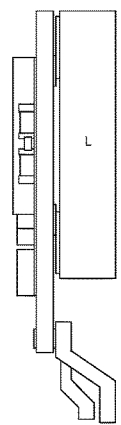
Figure 29D:
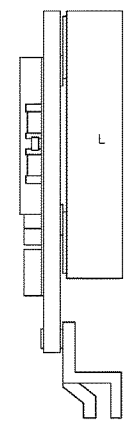
Figure 29E:
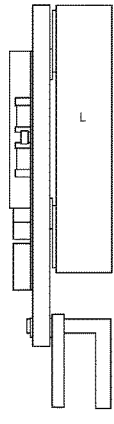
Figure 29F:
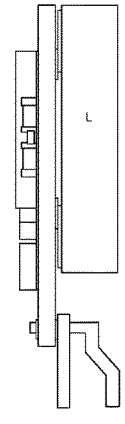
Figure 29G:
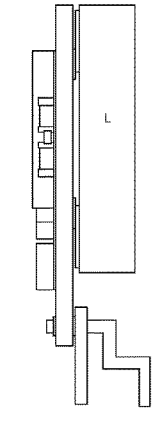
Figure 29H:
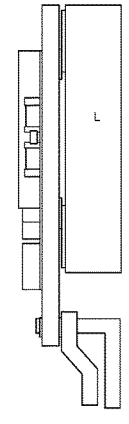
Figure 29I:
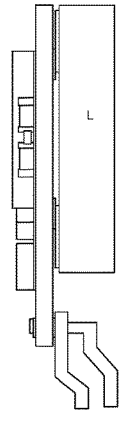
Figure 29J:
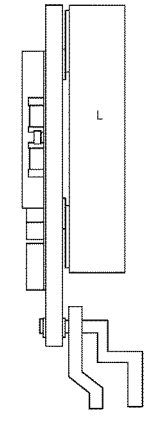
Figure 29W:
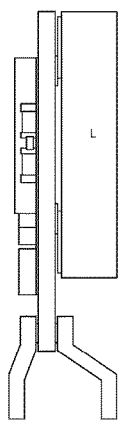
Figure 29X:
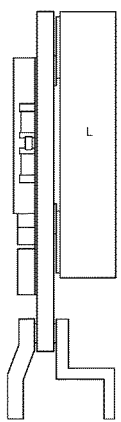
Figure 29Y:
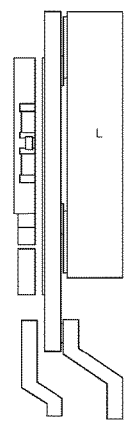
Figure 29Z:
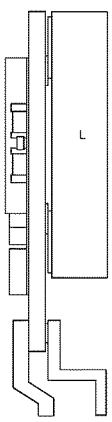
Figure 30A:
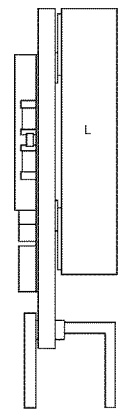
FIG. 30A-30I shows shapes of electrodes in accordance with an embodiment of the invention.
Figure 30B:
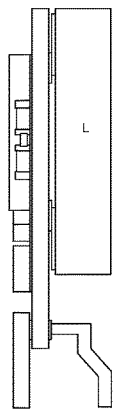
Figure 30C:
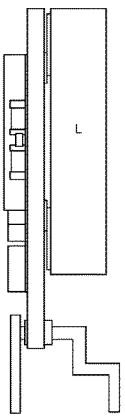
Figure 30D:
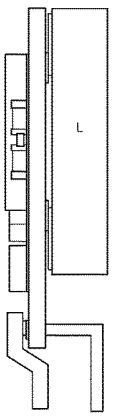
Figure 30E:
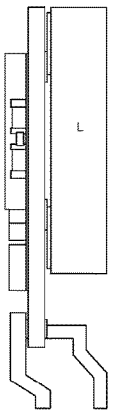
Figure 30F:
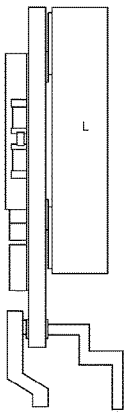
Figure 30G:
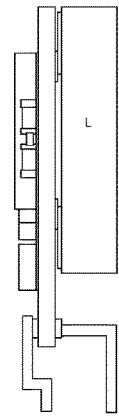
Figure 30H:
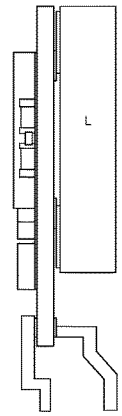
Figure 30I:
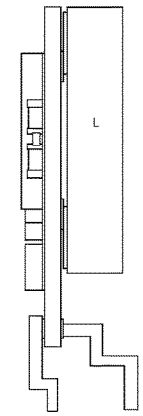

For another example, as shown in FIG. 27 wherein each lead 1300, 1301 is disposed on the top surface of the substrate 240 and a molding material can be used to encapsulate a portion of the lead 1300, 1301, wherein the lead portion 1302 can be inserted into a through-hole of the substrate 240.

They are many lead shapes for connecting the substrate 240 to the external circuit board 360 as shown from FIG. 28A to FIG. 30I, which can be seen by looking at those figures; and therefore, they are not described further.

In the exemplary embodiments described above, for motherboard makers (clients) having limited circuit layout area, the vertically upright electronic modules of the invention provide an advantage in occupying a smaller layout area versus other types of packaged electronic modules. Thus, with the smaller layout area, circuit design is less complex and overall power density may be raised. Additionally, with a less complex circuit design, reducing parasitic effects is simplified, thus, raising system efficiency. Meanwhile, clients can continue to use SMT manufacturing processes for connections, without having to change their original manufacturing processes. Partially or fully molded resin embodiments, embodiments with heat sinks attached to the electronic module and different cap-like structures may assist in this endeavor. Lastly, when the electronic modules of the invention are encased in a heat sink, the modules will have even more heat dissipation from the electronic devices therein, upright stability, EMI shielding and protection.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electronic module, comprising:
a magnetic device, comprising a body, wherein the body comprises a top surface, a bottom surface and a lateral surface connecting the top surface and the bottom surface of the body, wherein a first electrode and a second electrode of the magnetic device are disposed on the body; and
a first substrate, having a top surface, a bottom surface and a lateral surface connecting the top surface and the bottom surface of the first substrate, wherein at least one electronic device is disposed on the top or bottom surface of the first substrate, and the top surface of the magnetic body and the bottom surface of the first substrate are placed side by side with the first electrode of the magnetic device electrically connected to the first substrate, wherein a plurality of third electrodes are disposed on the first substrate and placed along an edge of the lateral surface of the first substrate, wherein the lateral surface of the first substrate faces the top surface of a second substrate, and each of the plurality of third electrodes is physically in contact with and electrically connected to a corresponding pad on the top surface of the second substrate.

2. The electronic module of claim 1, wherein the body is a magnetic body and a coil is disposed in the magnetic body, wherein the coil is electrically connected to a power device on the substrate through the first electrode of the magnetic device such that said power device is capable of providing power to the second substrate through the coil.

3. The electronic module of claim 1, wherein the first substrate is a PCB (printed circuit board), ceramic substrate, metallic substrate, insulated metal substrate (IMS) or a lead frame.

4. The electronic module of claim 1, wherein at least one portion of the second electrode of the magnetic device is disposed on the top surface of the magnetic body and electrically connected to the first substrate, wherein the lateral surface of the magnetic body is disposed on the second substrate.

5. The electronic module of claim 4, wherein the lateral surface of the magnetic body is adhered to the second substrate to increase the mechanical strength therebetween.

6. The electronic module of claim 1, wherein at least one portion of the second electrode of the magnetic device is disposed on the lateral surface of the magnetic body, wherein the second electrode of the magnetic device is soldered to the second substrate.

7. The electronic module of claim 1, wherein at least one portion of the second electrode of the magnetic device is disposed on the top surface of the magnetic body and electrically connected to the first substrate, wherein a conductive structure is disposed below the lateral surface of the magnetic body and electrically connected to the first substrate.

8. The electronic module of claim 1, wherein the magnetic device is an inductor.

9. The electronic module of claim 1, wherein each of the plurality of third electrodes is disposed in a recess or through-opening on the lateral surface of the substrate.

10. The electronic module of claim 1, wherein each of the plurality of third electrodes extends from the lateral surface of the substrate to a portion of the top surface or the bottom surface of the substrate.

11. The electronic module of claim 1, wherein the lateral surface of the magnetic body and the lateral surface of the first substrate are substantially at a same horizontal level.

12. The electronic module of claim 1, wherein a first recess is on the top or bottom surface of the substrate, wherein at least one portion of each of the plurality of third electrodes is disposed in the first recess.

13. The electronic module of claim 1, wherein a first recess is on the top or bottom surface of the substrate, wherein each of the plurality of third electrodes extends from the lateral surface of the substrate to the first recess.

14. The electronic module of claim 1, wherein a first recess is on the top surface and a second recess is on the bottom surface of the substrate, wherein each of the plurality of third electrodes extends from the lateral surface of the substrate to the first recess and the second recess.

15. The electronic module of claim 1, wherein each of the plurality of third electrodes has a metal lead, wherein each metal lead is mounted on the top or bottom surface of the first substrate and extends across a corresponding edge of the lateral surface of the substrate for electrically connecting with a second substrate.

16. The electronic module of claim 1, further comprising a heat sink disposed over the top surface of the first substrate to dissipate heat.

17. An electronic module, comprising:
an inductor, comprising a magnetic body and a coil disposed in the magnetic body, wherein the magnetic body comprises a top surface, a bottom surface and a lateral surface connecting the top surface and the bottom surface of the magnetic body, wherein a first electrode electrically connected to a first end of the coil and a second electrode electrically connected to a second end of the coil are disposed on the magnetic body;
a first substrate, having a top surface, a bottom surface and a lateral surface connecting the top surface and the bottom surface of the first substrate, wherein at least one electronic device is disposed on the top or bottom surface of the first substrate, and the top surface of the magnetic body and the bottom surface of the first substrate are placed side by side with the first electrode of the inductor electrically connected to the first substrate, wherein the coil is electrically connected to a power device on the first substrate through the first electrode of the inductor such that said power device is capable of providing power to a second substrate through the second electrode of the inductor, wherein each of the lateral surface of the first substrate and the lateral surface of the magnetic body faces the top surface of the second substrate, wherein a plurality of third electrodes are disposed on the first substrate and placed along an edge of the lateral surface of the first substrate, and each of the plurality of third electrodes is physically in contact with and electrically connected to a corresponding pad on the top surface of the second substrate.

18. The electronic module of claim 17, wherein at least one portion of the second electrode of the inductor is disposed on the lateral surface of the magnetic body, wherein the second electrode of the inductor is in contact with and electrically connected to the second substrate.

19. A circuit board, comprising:
- a first substrate having a top surface, a bottom surface and a lateral surface connecting the top surface and the bottom surface of the first substrate, wherein at least one electronic device is disposed on the top or bottom surface of the first substrate, and
- a plurality of third electrodes, disposed on the first substrate and placed along an edge of the lateral surface of the first substrate, wherein at least one portion of each of the plurality of third electrodes is disposed in a first recess on the top or bottom surface of the first substrate, wherein the lateral surface of the first substrate faces the top surface of a second substrate, and each of the plurality of third electrodes is physically in contact with and electrically connected to a corresponding pad on the top surface of the second substrate.

20. The circuit board of claim 19, wherein the first recess is on the top surface and a second recess is on the bottom surface of the first substrate, wherein each of the plurality of third electrodes has a first portion disposed in the first recess and a second portion disposed in the second recess.

* * * * *